(12) United States Patent
Tsuji et al.

(10) Patent No.: US 7,124,076 B2
(45) Date of Patent: Oct. 17, 2006

(54) ENCODING APPARATUS AND DECODING APPARATUS

(75) Inventors: Minoru Tsuji, Chiba (JP); Shiro Suzuki, Kanagawa (JP); Keisuke Toyama, Tokyo (JP)

(73) Assignee: Sony Corporation, Tokyo (JP)

( * ) Notice: Subject to any disclaimer, the term of this patent is extended or adjusted under 35 U.S.C. 154(b) by 871 days.

(21) Appl. No.: 10/203,775

(22) PCT Filed: Dec. 14, 2001

(86) PCT No.: PCT/JP01/10974

§ 371 (c)(1),
(2), (4) Date: Dec. 10, 2002

(87) PCT Pub. No.: WO02/49218

PCT Pub. Date: Jun. 20, 2002

(65) Prior Publication Data
US 2003/0138057 A1 Jul. 24, 2003

(30) Foreign Application Priority Data
Dec. 14, 2000 (JP) ............................. 2000-380639

(51) Int. Cl.
*G10L 19/02* (2006.01)
(52) U.S. Cl. ...................................... 704/205; 704/230
(58) Field of Classification Search ..................... None
See application file for complete search history.

(56) References Cited

U.S. PATENT DOCUMENTS

| | | | | |
|---|---|---|---|---|
| 4,441,200 A | * | 4/1984 | Fette et al. | 704/207 |
| 4,736,455 A | * | 4/1988 | Matsue et al. | 455/138 |
| 5,133,010 A | * | 7/1992 | Borth et al. | 704/264 |
| 5,664,055 A | * | 9/1997 | Kroon | 704/214 |
| 5,848,387 A | * | 12/1998 | Nishiguchi et al. | 704/217 |
| 6,108,621 A | * | 8/2000 | Nishiguchi et al. | 704/207 |
| 6,160,886 A | * | 12/2000 | Romesburg et al. | 379/406.05 |
| 6,173,257 B1 | * | 1/2001 | Gao | 704/220 |

FOREIGN PATENT DOCUMENTS

| | | |
|---|---|---|
| EP | 03-263925 | 11/1991 |
| JP | 03-132228 | 5/1991 |
| JP | 05-304479 | 11/1993 |

* cited by examiner

*Primary Examiner*—David D. Knepper
(74) *Attorney, Agent, or Firm*—Sonnenschein Nath & Rosenthal LLP

(57) ABSTRACT

The present invention relates to encoding apparatuses which allow encoding to be performed such that the occurrence of pre-echo and post-echo is suppressed. A predetermined waveform analysis is applied to a low-frequency-component input time-sequential signal which includes a high-frequency component occurring at a specific time, and a low-frequency-component time-sequential signal like that shown in FIG. 9A is generated according to a result of the analysis. The low-frequency-component time-sequential signal is removed from the input time-sequential signal to generate a residual time-sequential signal like that shown in FIG. 9B. An amplitude control process is applied such that the amplitude of the residual time-sequential signal is made almost constant in a block which serves as a unit of encoding to generate a time-sequential signal to be quantized, like that shown in FIG. 9C. The time-sequential signal to be quantized is quantized and encoded. The present invention can be applied to audio recording and reproduction apparatuses.

15 Claims, 25 Drawing Sheets

FIG. 8

| n | FREQUENCY fp TO BE PROCESSED | AMPLITUDE S | AMPLITUDE C |
|---|---|---|---|
| 1 | $f_1$ | $S_1$ | $C_1$ |
| 2 | $f_2$ | $S_2$ | $C_2$ |
| 3 | $f_3$ | $S_3$ | $C_3$ |
| ⋮ | ⋮ | ⋮ | ⋮ |
| N | $f_N$ | $S_N$ | $C_N$ |

FIG. 10

| n | FREQUENCY fp TO BE PROCESSED | AMPLITUDE A | PHASE P |
|---|---|---|---|
| 1 | $f_1$ | $A_1$ | $P_1$ |
| 2 | $f_2$ | $A_2$ | $P_2$ |
| 3 | $f_3$ | $A_3$ | $P_3$ |
| ⋮ | ⋮ | ⋮ | ⋮ |
| N | $f_N$ | $A_N$ | $P_N$ |

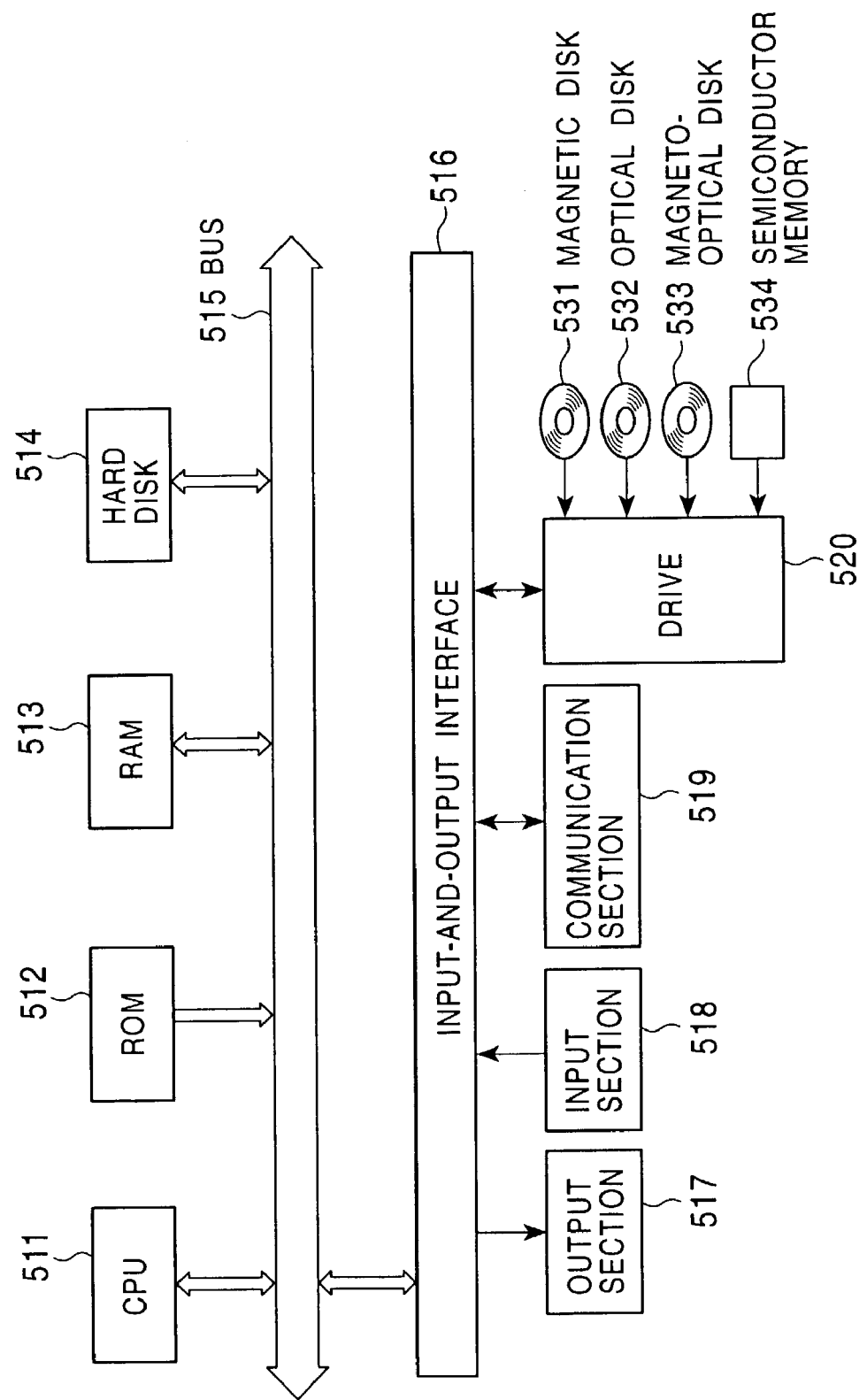

ENCODING APPARATUS AND DECODING APPARATUS

TECHNICAL FIELD

The present invention relates to encoding apparatuses and decoding apparatuses, and relates to encoding apparatuses and decoding apparatuses which are capable of suppressing the occurrence of pre-echo and post-echo.

BACKGROUND OF THE INVENTION

FIG. 1 shows example structures of a conventional encoding apparatus 1 and a conventional decoding apparatus 2.

An acoustic time-sequential signal SS sent to the encoding apparatus 1 is input to an amplitude control process section 11.

The amplitude control process section 11 divides the input acoustic time-sequential signal SS into blocks (having a fixed length) each of which serves as an encoding unit, further divides each block into a plurality of sub-blocks, and analyzes the amplitude of the acoustic time-sequential signal SS in each sub-block. According to the result of the amplitude analysis, the amplitude control process section 11 generates amplitude control process information G used in an amplitude control process for making an amplitude almost constant in a block. When the acoustic time-sequential signal SS in a block includes a high-frequency component locally generated, as shown in FIG. 2A, for example, the amplitude control process section 11 recognizes that the amplitude changed from an amplitude $H_1$ to an amplitude $H_2$ at a time $t_0$, and from the amplitude $H_2$ to the amplitude $H_1$ at a time $t_1$, and generates amplitude control process information G indicating the state.

The amplitude control process section 11 outputs the generated amplitude control process information G to a code-string generation section 14, and processes the amplitude of the acoustic time-sequential signal SS in each sub-block according to the amplitude control process information G. Specifically, the amplitude control process section 11 generates a time-sequential signal GS having an almost constant amplitude in each block, and sends it to a spectrum conversion section 12.

In a case shown in FIG. 2, the process process section 11 applies an amplitude control process to the acoustic time-sequential signal SS in a block shown in FIG. 2A so as to amplify the amplitude $H_1$ until the time $t_0$ and the amplitude $H_1$ after the time $t_1$ to the amplitude $H_2$, and outputs the time-sequential signal GS obtained as a result, like that shown in FIG. 2B, and having an almost constant amplitude in the block, to the spectrum conversion section 12.

The spectrum conversion section 12 decomposes the time-sequential signal GS sent from the amplitude control process section 11 into a spectrum F formed of frequency components according to MDCT (modified discrete cosine transform) or others, and outputs the spectrum F to a normalization/quantization section 13.

The normalization/quantization section 13 analyzes the spectrum F sent from the spectrum conversion section 12 to generate normalization information N. The normalization/quantization section 13 outputs the generated normalization information N to the code-string generation section 14, and normalizes the spectrum F according to the normalization information N.

The normalization/quantization section 13 also outputs predetermined quantization information Q to the code-string generation section 14, quantizes the normalized spectrum F according to the quantization information Q, and outputs spectrum information QF obtained as a result to the code-string generation section 14.

The code-string generation section 14 encodes the amplitude-control process information G sent from the amplitude control process section 11 and the normalization information N, the quantization information Q, and the spectrum information QF sent from the normalization/quantization section 13 to generate a code string CD. The generated code string is sent to the decoding apparatus 2.

The code string CD sent to the decoding apparatus 2 is input to a code-string decomposition section 21.

The code-string decomposition section 21 decomposes the input code string CD into the spectrum information QF, the quantization information Q, the normalization information N, and the amplitude control process information G, and outputs the spectrum information QF, the quantization information Q, and the normalization information N to a dequantization/denormalization section 21, and the amplitude control process information G to an inverse amplitude control process section 24.

The dequantization/denormalization section 22 dequantizes the spectrum information QF input from the code-string decomposition section 21 according to the quantization information Q, then, denormalizes it according to the normalization information N, and outputs a spectrum F' obtained as a result and corresponding to the spectrum F generated in the encoding apparatus 1 (spectrum conversion section 12) to an inverse spectrum conversion section 23.

The inverse spectrum conversion section 23 applies inverse spectrum conversion to the spectrum F' sent from the dequantization/denormalization section 22, according to IMDCT (inverse MDCT: inverse modified discrete cosine transform) to generate a time-sequential signal, and outputs the time-sequential signal GS' obtained as a result and corresponding to the time-sequential signal GS generated by the encoding apparatus 1 (amplitude control process section 11), to the inverse amplitude control process section 24.

For example, the time-sequential signal GS' corresponding to the time-sequential signal GS shown in FIG. 2B is generated, and output to the inverse amplitude control process section 24.

The inverse amplitude control process section 24 applies an amplitude control process based on the amplitude control process information G sent from the code-string decomposition section 21, that is, an amplitude control process for processing an amplitude inversely to the amplitude control process performed in the encoding apparatus 1 (amplitude control process section 11), to the time-sequential signal GS' sent from the inverse spectrum conversion section 23, and outputs an acoustic time-sequential signal SS' obtained as a result and corresponding to the acoustic time-sequential signal SS input to the encoding apparatus 1, to the outside.

For example, the acoustic time-sequential signal SS' corresponding to the acoustic time-sequential signal SS shown in FIG. 2A is generated and output to the outside.

As described above, since a portion having a small amplitude (such as portions having the amplitude $H_1$ in the acoustic time-sequential signal SS shown in FIG. 2A) in the acoustic time-sequential signal SS is amplified, and encoded after the amplitude control process (such as that shown in FIG. 2B) for making an amplitude almost constant in a block is performed, in the encoding apparatus 1, and the amplitude control process for making the amplified portion to the original state is performed and a code string is decoded in the decoding apparatus 2, the occurrence of pre-echo and post-echo, which can be heard when quantization noise is not masked by a small-amplitude signal, is suppressed.

When the acoustic time-sequential signal SS in a block is a low-frequency-component time-sequential signal having a large amplitude $H_{11}$, like that shown in FIG. 3A, which includes a high-frequency component occurring at a partial time, like that shown in FIG. 3B, for example, the encoding apparatus 1 (amplitude control process section 11) recognizes that the amplitude in the block is constant at the amplitude $H_{11}$ by amplitude analysis applied to the acoustic time-sequential signal SS.

More specifically, since the amplitude control process for amplifying a portion having a small amplitude is not performed, and a time-sequential signal GS similar to the acoustic time-sequential signal SS (shown in FIGS. 3A and 3C) is generated, spectrum-converted, normalized, quantized, and encoded in the encoding apparatus 1, and the amplitude control process for making the amplitude back to the original state is not performed and a code string is decoded in the decoding apparatus 2, an acoustic time-sequential signal SS' like that shown in FIG. 3C, including a diffused high-frequency-component quantization noise like that shown in FIG. 3D, is generated, and pre-echo and post-echo are heard at portions enclosed by dotted lines in FIG. 3C, for example, without being masked.

As described above, the conventional encoding apparatus 1 or the conventional decoding apparatus 2 does not appropriately suppress pre-echo or post-echo.

SUMMARY OF THE INVENTION

The present invention has been made in consideration of the above situations. An object of the present invention is to allow an acoustic time-sequential signal SS to be encoded and decoded such that pre-echo and post-echo are appropriately suppressed.

An encoding apparatus according to the present invention is characterized by including division means for dividing an input time-sequential signal into predetermined-length blocks; low-frequency-component-signal generation means for applying a predetermined frequency analysis to the input time-sequential signal in the blocks and for generating a low-frequency-component signal according to predetermined waveform information based on a result of the analysis; residual-signal generation means for removing the low-frequency-component signal from the input time-sequential signal in the blocks to generate a residual signal; amplitude control process means for analyzing the amplitude of the residual signal and for applying a predetermined amplitude control process to the residual signal according to predetermined amplitude control process information based on a result of the analysis to generate a signal to be quantized; quantization means for quantizing the signal to be quantized to generate a quantized signal; and code-string generation means for encoding the waveform information, the amplitude control process information, and the quantized signal to generate a code string.

The quantization means may be provided with frequency-component generation means for converting the signal to be quantized to frequency components to generate a frequency-component signal, and means for normalizing and quantizing the frequency-component signal to generate the quantized signal.

The frequency-component generation means may apply spectrum conversion to the signal to be quantized to generate the frequency-component signal.

The low-frequency-component-signal generation means may perform the frequency analysis according to a general harmonic analysis method, and generates the low-frequency-component signal according to the waveform information based on a result of the analysis.

It may be possible that the low-frequency-component-signal generation means quantizes the waveform information to generate quantized waveform information, dequantizes the quantized waveform information to generate dequantized waveform information, and generates the low-frequency-component signal according to the dequantized waveform information, and the code-string generation means encodes the quantized waveform information, the amplitude control process information, and the quantized signal to generate the code string.

It may be possible that the division means divides the input time-sequential signal into the blocks such that a part of the input time-sequential signal overlaps, and the low-frequency-component-signal generation means synthesizes a low-frequency-component signal in a block concerned, a low-frequency-component signal in the previous block, overlapping with the signal in the block concerned, and a low-frequency-component signal in the next block, overlapping with the signal in the block concerned, in a time domain to generate a low-frequency-component signal.

The low-frequency-component-signal generation means may apply a window function to the low-frequency-component signal.

Further, an encoding apparatus according to the present invention, low-frequency-component-signal generation means for dividing an input time-sequential signal into M band signals, for dividing the band signals into predetermined blocks, for applying a predetermined frequency analysis to a signal in a block of at least one band signal, and for generating a low-frequency-component signal according to predetermined waveform information based on a result of the analysis, and residual-signal generation means for removing the low-frequency-component signal from the band signal to generate a residual signal, and can analyze the amplitude of the residual signal and apply a predetermined amplitude control process to the residual signal according to predetermined amplitude control process information based on a result of the analysis to generate a signal to be quantized.

An encoding method according to the present invention is characterized by including a division step of dividing an input time-sequential signal into predetermined-length blocks; a low-frequency-component-signal generation step of applying a predetermined frequency analysis to the input time-sequential signal in the blocks and of generating a low-frequency-component signal according to predetermined waveform information based on a result of the analysis; a residual-signal generation steps of removing the low-frequency-component signal from the input time-sequential signal in the blocks to generate a residual signal; a signal-to-be-quantized generation step of analyzing the amplitude of the residual signal and of applying a predetermined amplitude control process to the residual signal according to predetermined amplitude control process information based on a result of the analysis to generate a signal to be quantized; a quantization step of quantizing the signal to be quantized to generate a quantized signal; and a code-string generation step of encoding the waveform information, the amplitude control process information, and the quantized signal to generate a code string.

A first program according to the present invention is characterized by including a division step of dividing an input time-sequential signal into predetermined-length blocks; a low-frequency-component-signal generation step of applying a predetermined frequency analysis to the input time-sequential signal in the blocks and of generating a low-frequency-component signal according to predetermined waveform information based on a result of the analysis; a residual-signal generation step of removing the low-frequency-component signal from the input time-sequential signal in the blocks to generate a residual signal; a signal-to-be-quantized generation step of analyzing the amplitude of the residual signal and of applying a predetermined amplitude control process to the residual signal according to predetermined amplitude control process information based on a result of the analysis to generate a signal to be quantized; a quantization step of quantizing the signal to be quantized to generate a quantized signal; and a code-string generation step of encoding the waveform information, the amplitude control process information, and the quantized signal to generate a code string.

A decoding apparatus according to the present invention is characterized by including decomposition means for decomposing the code string into waveform information, amplitude control process information, and a quantized signal; means for dequantizing the quantized signal; inverse amplitude control process means for applying an amplitude control process inverse to that performed in encoding, to the dequantized signal according to the amplitude control process information to generate a signal to which the amplitude control process has been applied; low-frequency-component-signal generation means for generating a low-frequency-component signal according to the waveform information; and means for generating a time-sequential signal from the signal to which the amplitude control process has been applied, and the low-frequency-component signal.

When the waveform information has been quantized, the low-frequency-component-signal generation means may dequantize the quantized waveform information and, according to information obtained as a result, generate the low-frequency-component signal.

When division has been made such that a part of the blocks overlap, the low-frequency-component-signal generation means may synthesize a low-frequency-component signal in a block concerned, a low-frequency-component signal in the previous block, overlapping with the signal in the block concerned, and a low-frequency-component signal in the next block, overlapping with the signal in the block concerned, in a time domain to generate a low-frequency-component signal.

A decoding method according to the present invention is characterized by including a decomposition step of decomposing a code string into waveform information, amplitude control process information, and a quantized signal; a step of dequantizing the quantized signal; an inverse amplitude control process step of applying an amplitude control process inverse to that performed in encoding, to the dequantized signal according to the amplitude control process information to generate a signal to which the amplitude control process has been applied; a low-frequency-component-signal generation step of generating a low-frequency-component signal according to the waveform information; and a step of generating a time-sequential signal from the signal to which the amplitude control process has been applied, and the low-frequency-component signal.

A second program according to the present invention is characterized by including a decomposition step for decomposing a code string into waveform information, amplitude control process information, and a quantized signal; a step for dequantizing the quantized signal; an inverse amplitude control process step for applying an amplitude control process inverse to that performed in encoding, to the dequantized signal according to the amplitude control process information to generate a signal to which the amplitude control process has been applied; a low-frequency-component-signal generation step for generating a low-frequency-component signal according to the waveform information; and a step for generating a time-sequential signal corresponding to an encoded time-sequential signal, from the signal to which the amplitude control process has been applied, and the low-frequency-component signal.

BRIEF DESCRIPTION OF THE DRAWINGS

FIG. 8 is a view showing an example of waveform information E.

FIG. 10 is a view showing another example of the waveform information E.

FIG. 25 is a block diagram showing an example structure of a computer.

DETAILED DESCRIPTION OF THE PRESENTLY PREFERRED EMBODIMENTS

Figure 1:
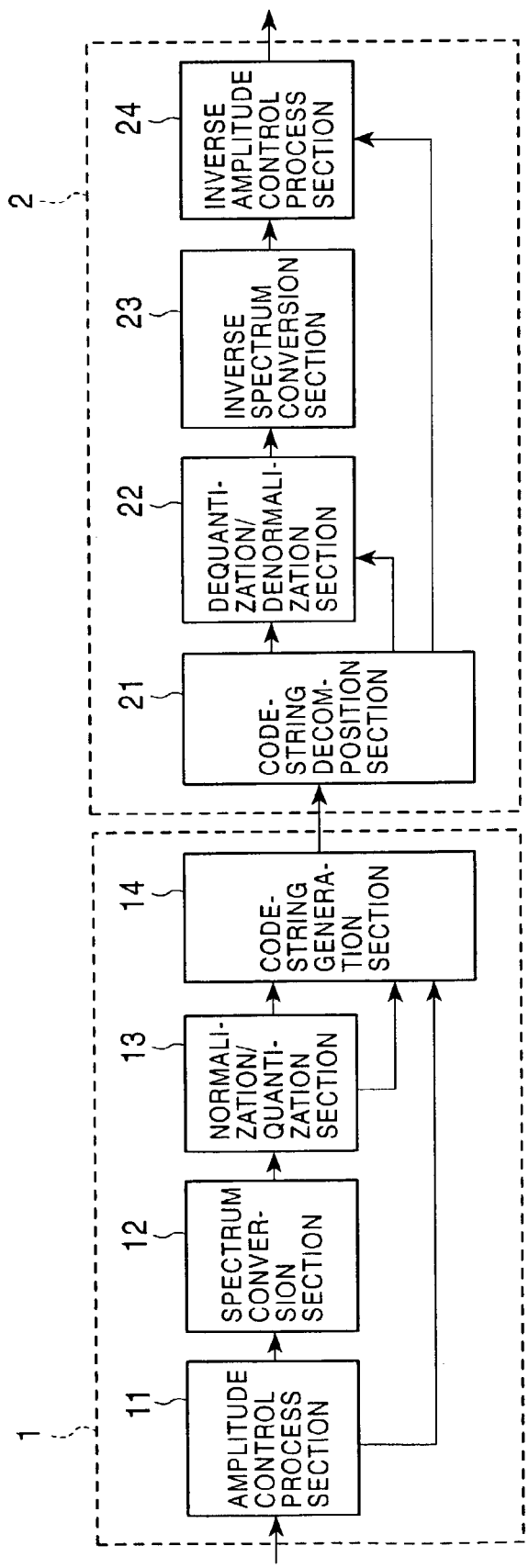
FIG. 1 is a block diagram of example structures of a conventional encoding apparatus and a conventional decoding apparatus.
Figure 2A:
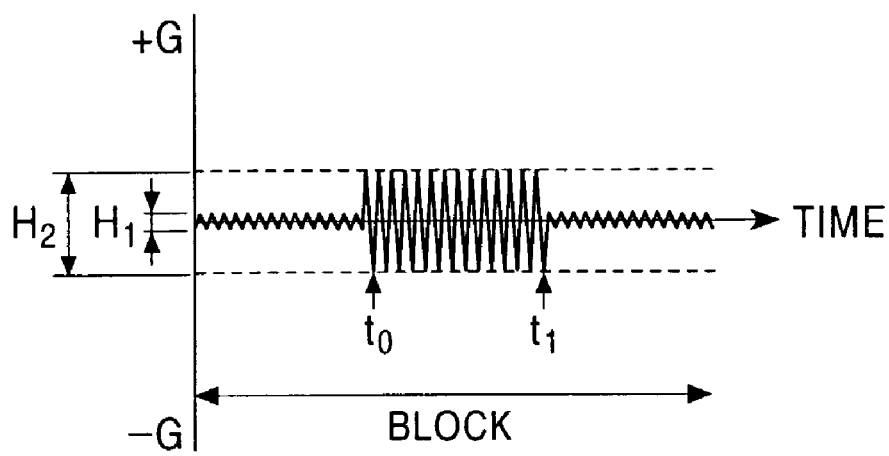
FIG. 2A is a view describing an amplitude control process.
Figure 2B:
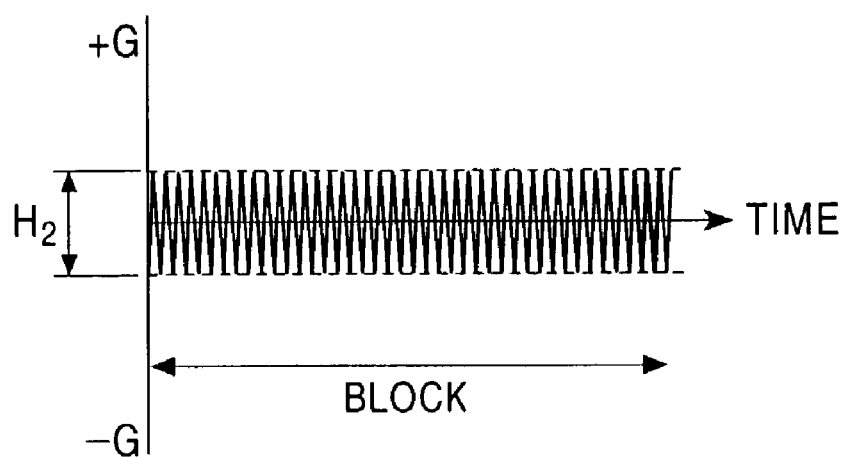
FIG. 2B is another view describing the amplitude control process.
Figure 3A:
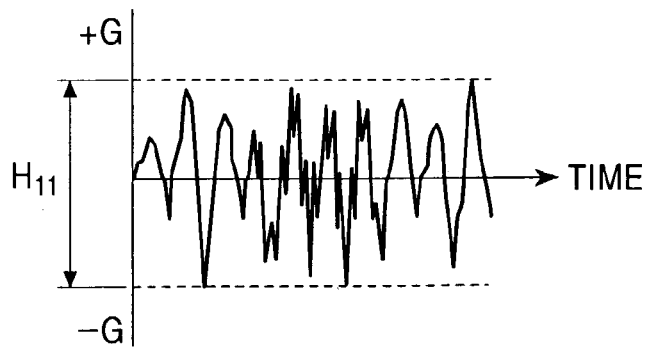
FIG. 3A is a view describing the operations of the conventional encoding apparatus and the conventional decoding apparatus.
Figure 3B:
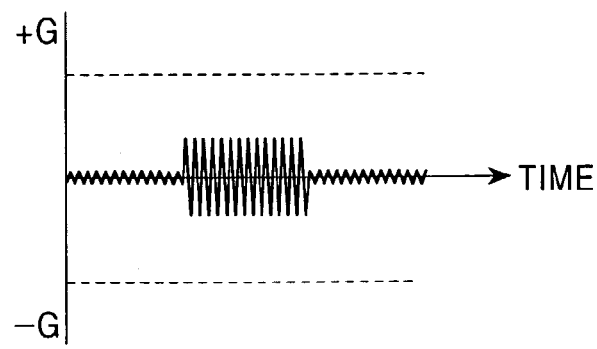
FIG. 3B is another view describing the operations of the conventional encoding apparatus and the conventional decoding apparatus.
Figure 3C:
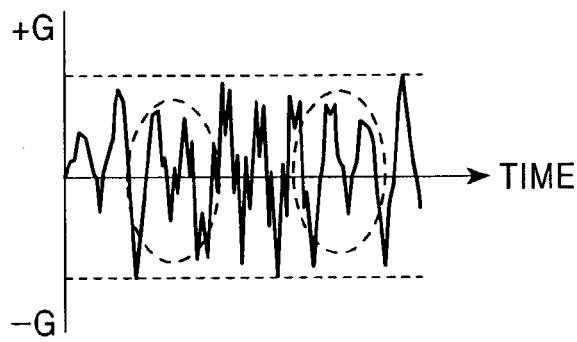
FIG. 3C is another view describing the operations of the conventional encoding apparatus and the conventional decoding apparatus.
Figure 3D:
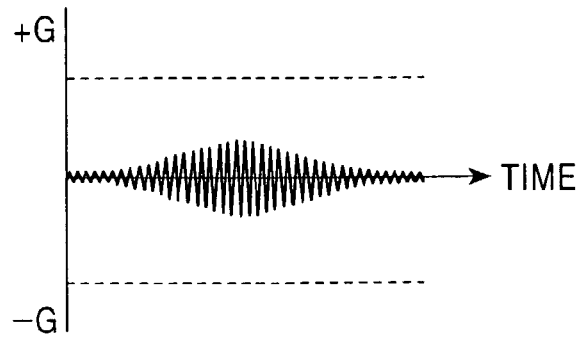
FIG. 3D is another view describing the operations of the conventional encoding apparatus and the conventional decoding apparatus.
Figure 4:
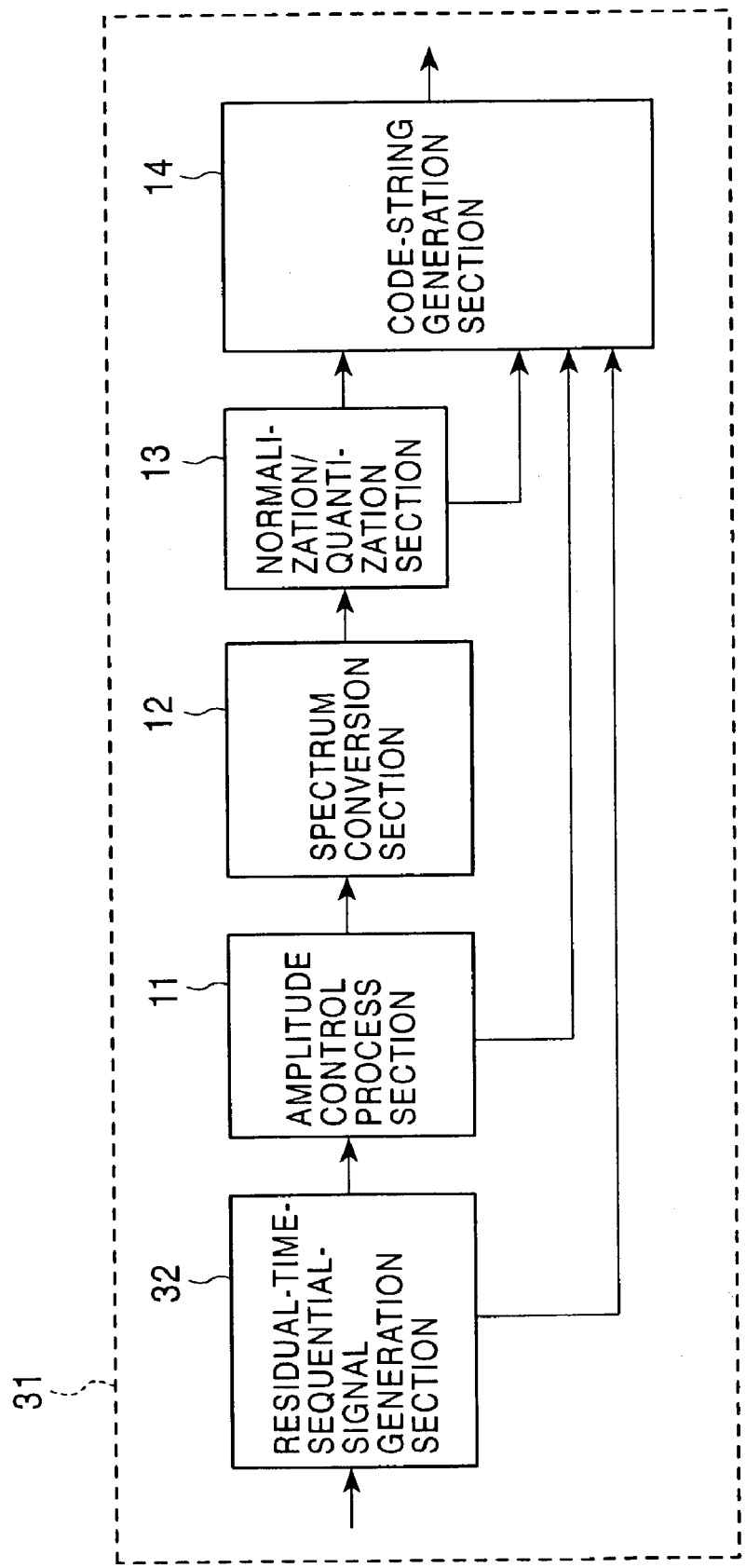
FIG. 4 is a block diagram of an example structure of an encoding apparatus to which the present invention is applied.

FIG. 4 shows an example structure of an encoding apparatus 31 to which the present invention is applied. The encoding apparatus 31 is provided with a residual-time-sequential-signal generation section 32 at a previous stage of the amplitude control process section 11 of the encoding apparatus 1 shown in FIG. 1. Since the other structures of the encoding apparatus 31 are the same as those shown in FIG. 1, a description thereof will be omitted as required.

The residual-time-sequential-signal generation section (hereinafter abbreviated as a generation section) 32 divides an input acoustic time-sequential signal SS into blocks each of which serves as an encoding unit, applies a predetermined frequency analysis to each block, and according to a result of the analysis, generates waveform information E.

The generation section 32 outputs the generated waveform information E to the code-string generation section 14, subtracts (removes) a low-frequency-component time-sequential signal ES generated according to the waveform information E, from the acoustic time-sequential signal SS to generate a residual time-sequential signal RS, and outputs it to the amplitude control process section 11. In other words, the low-frequency component of the acoustic time-sequential signal SS is removed, and the remaining signal is sent to the amplitude control process section 11 as the residual time-sequential signal RS.

The amplitude control process section 11 analyzes the amplitude of the residual time-sequential signal RS sent from the generation section 32, in each sub-block, and generates amplitude control process information G used for maintaining the amplitude at an almost constant level within the block, according to a result of the analysis.

The amplitude control process section 11 outputs the generated amplitude control process information G to the code-string generation section 14, processes the amplitude of the residual time-sequential signal RS in each sub-block according to the amplitude control process information G, and outputs a time-sequential signal GS obtained as a result and having an almost constant amplitude in each block to the spectrum conversion section 12.

The code-string generation section 14 receives the waveform information E from the generation section 32, the amplitude control process information G from the amplitude control process section 11, and normalization information N, quantization information Q, and spectrum information QF from the normalization/quantization section 13, and encodes these pieces of information to generate a code string CD. The generated code string CD is sent to a decoding apparatus 51 (shown in FIG. 11), described later.

Figure 5:
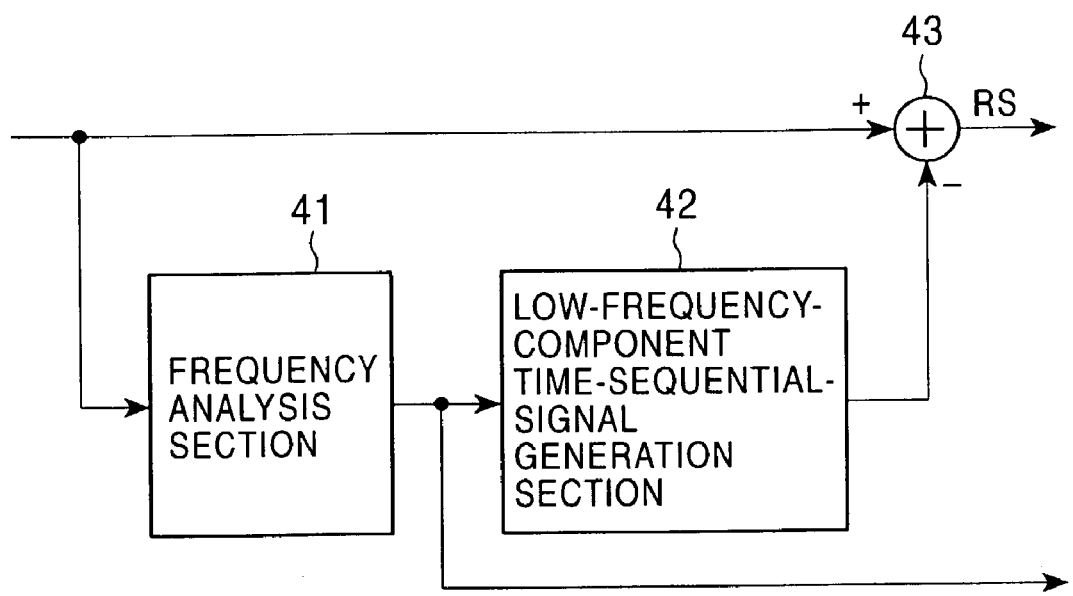
FIG. 5 is a block diagram of an example structure of a low-frequency-component time-sequential-signal generation section shown in FIG. 4.

FIG. 5 shows an example structure of the generation section 32. The acoustic time-sequential signal SS is input to a frequency analysis section 41 and to a subtracter 43.

The frequency analysis section 41 applies the frequency analysis to the acoustic time-sequential signal SS divided into blocks by a division section not shown; according to a result of the analysis, generates the waveform information E used for generating the low-frequency-component time-sequential signal ES; and outputs the waveform information E to a low-frequency-component time-sequential-signal generation section 42 and to the code-string generation section 14 (shown in FIG. 4).

The low-frequency-component time-sequential-signal generation section (hereinafter abbreviated as a generation section) 42 generates the low-frequency-component time-sequential signal ES according to the waveform information E sent from the frequency analysis section 41, and outputs it to the subtracter 43.

The subtracter 43 subtracts the low-frequency-component time-sequential signal ES sent from the generation section 42, from the input acoustic time-sequential signal SS, in a time domain, and outputs the residual time-sequential signal RS obtained as a result to the amplitude control process section 11.

Figure 6:
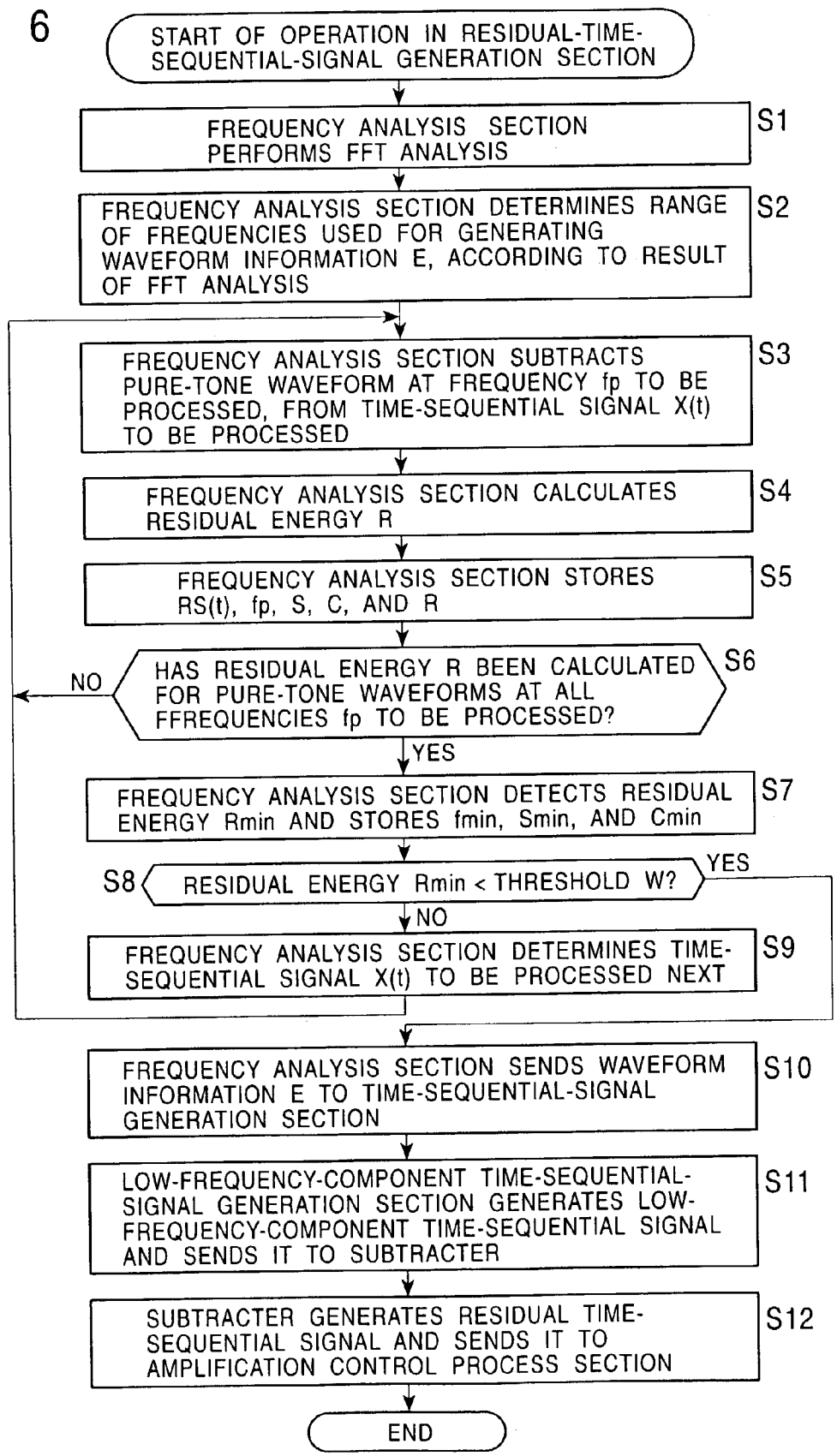
FIG. 6 is a flowchart describing the operation of the low-frequency-component time-sequential-signal generation section shown in FIG. 4.

The operation of the generation section 32 will be described below by referring to a flowchart shown in FIG. 6. The frequency analysis section 41 applies FFT analysis to the acoustic time-sequential signal SS in each block in step S1, and determines the range of frequencies used for generating the waveform information E according to a result of the analysis in step S2.

Figure 7A:
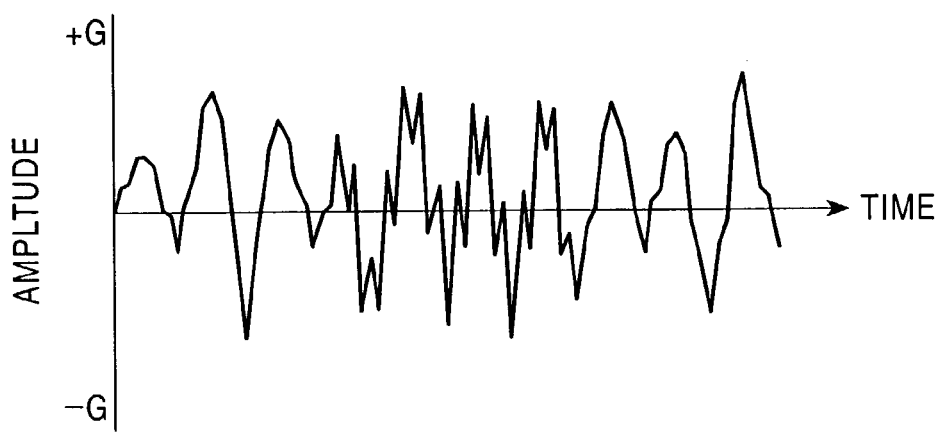
FIG. 7A is a view describing the process of step S2 shown in FIG. 6.
Figure 7B:
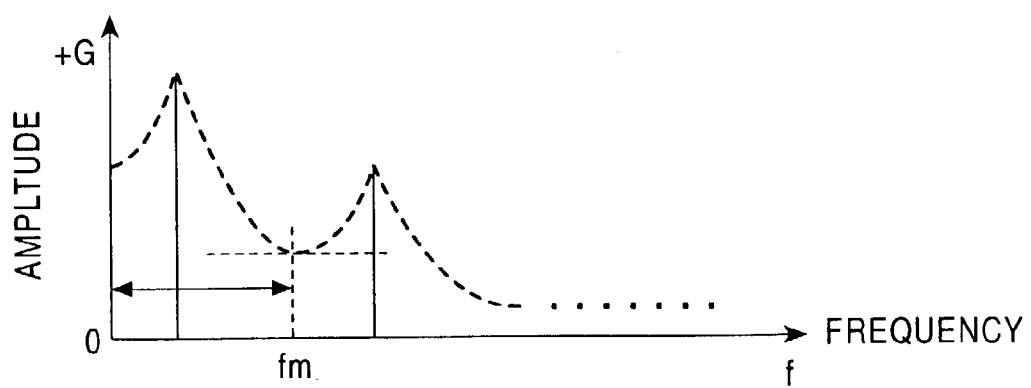
FIG. 7B is another view describing the process of Step S2 shown in FIG. 6.

When FFT analysis is applied to an acoustic time-sequential signal SS having a large amplitude like that shown in FIG. 7A, for example, a distribution like that shown in FIG. 7B is obtained. As a result of the analysis, the frequency analysis section 41 detects a distribution having two peaks and a minimal value at a frequency $f_m$ between an earliest (first) peak and a second peak. From a result of the detection, the frequency analysis section 41 sets the range of frequencies used for generating the waveform information E to 0 to the frequency $f_m$ (range indicated by an left and right arrow in FIG. 7B).

In step S3, the frequency analysis section 41 uses an expression (1) to calculate the pure-tone waveform Q(t) of a frequency $f_p$ to be handled within the range of frequencies determined in step S2; and sets a time-sequential signal x(t) to be handled to the acoustic time-sequential signal SS in each block, and uses an expression (2) to calculate a residual component RS(t).

$$Q(t) = S \sin(2\pi \times f_p \times t) - C \cos(2\pi \times f_p \times t) \tag{1}$$

$$RS(t) = x(t) - Q(t) \tag{2}$$

In the expression (1), fp indicates the frequency to be handled, S indicates the amplitude of a sine term of the pure-tone waveform and is obtained by an expression (3), C indicates the amplitude of a cosine term of the pure-tone waveform and is obtained by an expression (4), and L indicates the length of each block.

$$S = \frac{2}{L} \int_0^L x(t) \sin(2\pi \times f_p \times t) \tag{3}$$

$$C = \frac{2}{L} \int_0^L x(t) \cos(2\pi \times f_p \times t) \tag{4}$$

Then, in step S4, the frequency analysis section 41 uses an expression (5) to calculate the energy (hereinafter called a residual energy) of the residual component RS(t) calculated in step S3.

$$R = \int_0^L RS(t)^2 \, dt \tag{5}$$

In step S5, the frequency analysis section 41 associates the residual component RS(t) calculated in step S3; the frequency $f_p$ to be handled, the amplitude S, and the amplitude C all used in step S3; and the residual energy R calculated in step S4 with each other and stores them.

Next, in step S6, the frequency analysis section 41 determines whether the residual energy R corresponding to the time-sequential signal x(t) to be processed has been calculated for the pure-tone waveforms of all frequencies $f_p$ to be processed. When it is determined that the residual energy R has not yet been calculated for the pure-tone waveforms of all frequencies $f_p$ to be processed, the procedure returns to step S3, and the processes of step S3 to step S5 are executed for the pure-tone waveform of the next frequency $f_p$ to be processed.

When it is determined in step S6 that the residual energy R has been calculated for the pure-tone waveforms of all frequencies $f_p$ to be processed, the procedure proceeds to step S7. The frequency analysis section 41 detects the minimum value (hereinafter called residual energy $R_{min}$) among the residual energy R calculated in step S4 (stored in step S5) and stores $f_{min}$, $S_{min}$, and $C_{min}$ where $f_{min}$ indicates the frequency $f_p$ to be processed, used when the residual energy $R_{min}$ is calculated, $S_{min}$ indicates a value obtained by an expression (6), and $C_{min}$ indicates a value obtained by an expression (7). In the expressions (6) and (7), x(t) indicates the current x(t).

$$S_{min} = \frac{2}{L} \int_0^L x(t) \sin(2\pi \times f_{min} \times t) \tag{6}$$

$$C_{min} = \frac{2}{L} \int_0^L x(t) \cos(2\pi \times f_{min} \times t) \tag{7}$$

Next, in step S8, the frequency analysis section 41 determines whether the residual energy $R_{min}$ detected in step S7 is smaller than a predetermined threshold W. When it is determined that the residual energy $R_{min}$ is not smaller than the threshold W, the processing proceeds to step S9, and the frequency analysis section 41 uses an expression (8) to calculate the time-sequential signal x(t) to be processed next.

$$\text{Next } x(t) = \text{current } x(t) - S_{min} \sin(2\pi \times f_{min} \times t) - C_{min} \sin(2\pi \times f_{min} \times t) \tag{8}$$

Then, the processing returns to step S3, and the frequency analysis section 41 executes the following processes.

When it is determined in step SB that the residual energy $R_{min}$ is smaller than the threshold W, the procedure proceeds to step S10, and the frequency analysis section 41 outputs the data stored in step S7 like that shown in FIG. 8, that is, the frequency $f_p$ to be processed, the amplitude $S_n$, and the amplitude $C_n$ to the generation section 42 as the waveform information E.

The processes of step S1 to S10 executed by the frequency analysis section 41 conforms to the general harmonic analysis method proposed by Wiener. The general harmonic analysis method is described in "The Fourier integral and certain of its applications" written by N. Weiner, Dover Publications, Inc., 1958.

Next, in step S11, the generation section 42 uses the waveform information E sent from the frequency analysis section 41 to do calculation according to an expression (9) to generate the low-frequency-component time-sequential signal ES(t), and outputs it to the subtracter 43.

$$ES(t) = \sum_{n=1}^{N} (S_n \sin(2\pi \times f_n \times t) + C_n \cos(2\pi \times f_n \times t)) \tag{9}$$

Figure 9A:
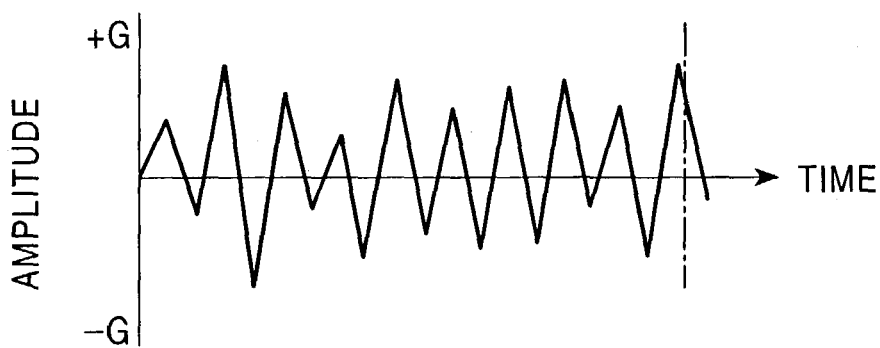
FIG. 9A is a view describing the operation of the encoding apparatus to which the present invention is applied.

When an acoustic time-sequential signal SS in a block is a signal formed of a low-frequency component like that shown in FIG. 7A, for example, a low-frequency-component time-sequential signal ES(t) like that shown in FIG. 9A is generated according to waveform information E obtained as a result of the process of step S1 to step S11 executed by the frequency analysis section 41.

Figure 9B:
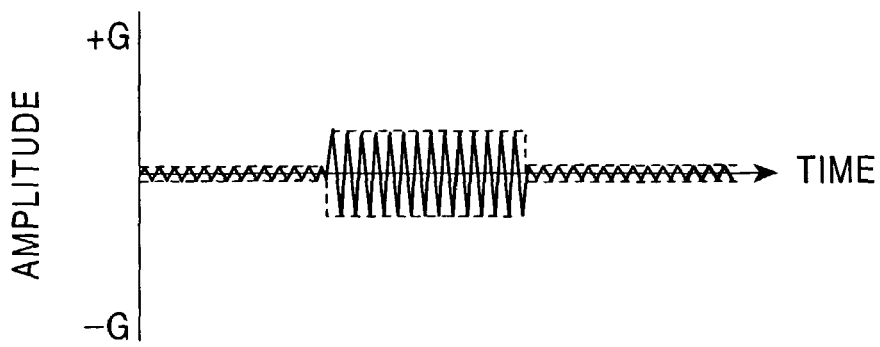
FIG. 9B is another view describing the operation of the encoding apparatus to which the present invention is applied.

In step S12, the subtracter 43 subtracts the low-frequency-component time-sequential signal ES(t) sent from the generation section 42, from the input acoustic time-sequential signal SS, in a time domain to generate the residual time-sequential signal RS(t) and outputs it to the amplitude control process section 11. Specifically, for example, the low-frequency-component time-sequential signal ES shown in FIG. 9A is subtracted from the acoustic time-sequential signal SS shown in FIG. 7A, and the residual time-sequential signal RS(t) obtained as a result and like that shown in FIG. 9B is output to the process amplitude section 11.

Since the residual time-sequential signal RS, formed of only high-frequency components, is sent to the amplitude control process section 11 in this way, the amplitude control process section 11 applies an amplitude control process to the residual time-sequential signal RS such that portions having small amplitudes are amplified in the residual time-sequential signal RS to make the signal have an almost constant amplitude in the block. As a result, a time-sequential signal GS, like that shown in FIG. 9C, having an almost constant amplitude in the block is generated.

The frequency analysis section 41 stores data in step S5 each time the processes of step S3 to step S7 are repeated. When it is determined in step S6 that YES is obtained, and the process of step S5 is again executed through step S9, data which has been stored is deleted, and then new data is stored.

In the above description, the frequency $f_n$ to be processed, the amplitude $S_n$, and the amplitude $C_n$ are output to the generation section 42 as the waveform information E. It may be possible that calculations are performed according to expressions (10) and (11) to obtain an amplitude A and a phase P, and the frequency $f_n$ to be processed, the amplitude $A_n$, and the phase $P_n$ are output to the generation section 42 as the waveform information E, as shown in FIG. 10. In this case, in step S12, the generation section 42 performs a calculation according to an expression (12), instead of an expression (9), to obtain a low-frequency-component time-sequential signal ES(t).

$$A = \sqrt{S^2 + C^2} \quad (1)$$

$$P = \arctan\left(\frac{C}{S}\right) \quad (11)$$

$$ES(t) = \sum_{n=1}^{N} (A_n \sin(2\pi \times f_n \times t)) \quad (12)$$

In the above description, when it is determined in step S8 that the residual energy $R_{min}$ is smaller than the threshold W, the procedure proceeds to step S10, in other words, the frequency analysis is finished. Even if the residual energy $R_{min}$ does not become smaller than the threshold W, when the residual energy $R_{min}$ is calculated for a predetermined number of times, for example, the frequency analysis may be finished.

Figure 11:
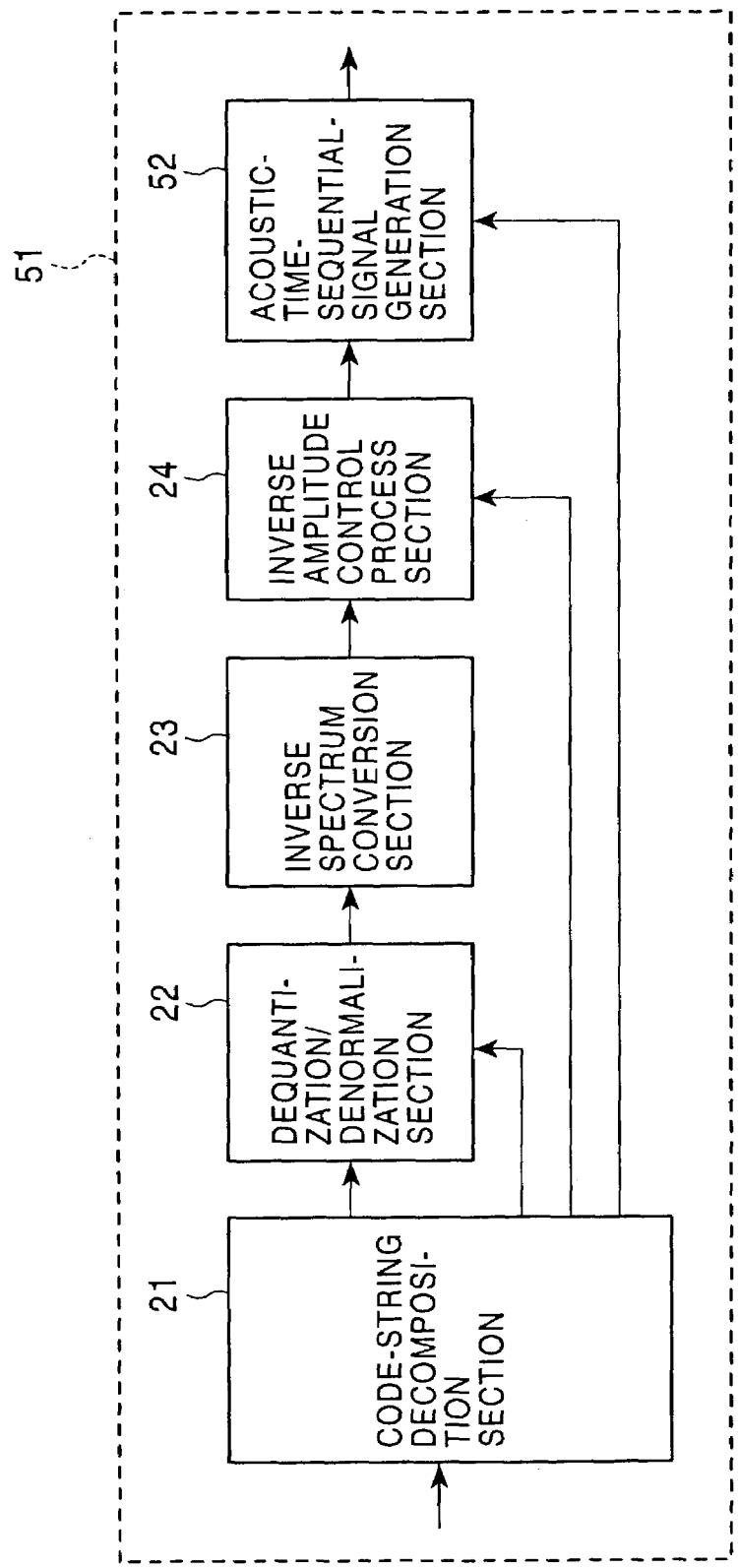
FIG. 11 is a block diagram showing an example structure of a decoding apparatus to which the present invention is applied.

FIG. 11 shows an example structure of a decoding apparatus 51 for decoding a code string CD generated by the encoding apparatus 31 shown in FIG. 4, the present invention being applied to the decoding apparatus 51. The decoding apparatus 51 is further provided with an acoustic-time-sequential-signal generation section (hereinafter abbreviated as a generation section) 52 at a subsequent stage of the inverse amplitude control process section 24 in the decoding apparatus 2 shown in FIG. 1. The other structures of the decoding apparatus 51 are the same as those shown in FIG. 1.

The code string CD generated by the encoding apparatus 31 and sent to the decoding apparatus 51 is sent to the code-string decomposition section 21.

The code-string decomposition section 21 decomposes the input code string CD into spectrum information QF, quantization information Q, normalization information N, amplitude control process information G, and waveform information E; and outputs the spectrum information QF, the quantization information Q, and the normalization information N to the dequantization/denormalization section 22, the amplitude control process information G to the inverse amplitude control process section 24, and the waveform information E to the generation section 52. Specifically, for example, the waveform information E used for generating the low-frequency-component time-sequential signal ES generated by the encoding apparatus 31 (the frequency analysis section 41 (shown in FIG. 5) of the generation section 32) and shown in FIG. 9A is sent to the generation section 52.

The dequantization/denormalization section 22 dequantizes the spectrum information QF input from the code-string decomposition section 21 according to the quantization information Q, then, denormalizes it according to the normalization information N, and outputs a spectrum F' obtained as a result to the inverse spectrum conversion section 23.

Figure 9C:
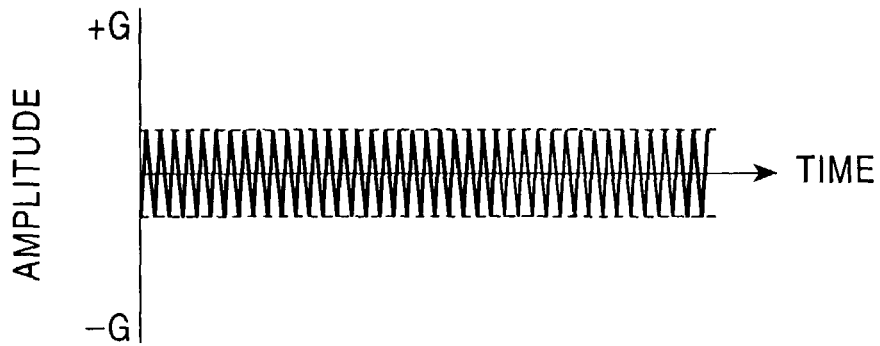
FIG. 9C is another view describing the operation of the encoding apparatus to which the present invention is applied.

The inverse spectrum conversion section 23 applies inverse spectrum conversion to the spectrum F' sent from the dequantization/denormalization section 22. Specifically, as a result, a time-sequential signal GS' corresponding to the time-sequential signal GS generated by the encoding apparatus 31 (amplitude control process section 11) and shown in FIG. 9C is generated.

The inverse spectrum conversion section 23 outputs the generated time-sequential signal GS' to the inverse amplitude control process section 24.

The inverse amplitude control process section 24 applies an amplitude control process based on the amplitude control process information G sent from the code-string decomposition section 21, that is, an amplitude control process for processing an amplitude inversely to the amplitude control process performed in the encoding apparatus 31 (amplitude control process section 11), to the time-sequential signal GS' sent from the inverse spectrum conversion section 23. As a result, for example, the inverse amplitude control process section 24 generates a residual time-sequential signal RS' corresponding to the residual time-sequential signal RS generated by the encoding apparatus 31 (generation section 32) and shown in FIG. 9B.

The inverse amplitude control process section 24 outputs the generated residual time-sequential signal RS' to the generation section 52.

Figure 12:
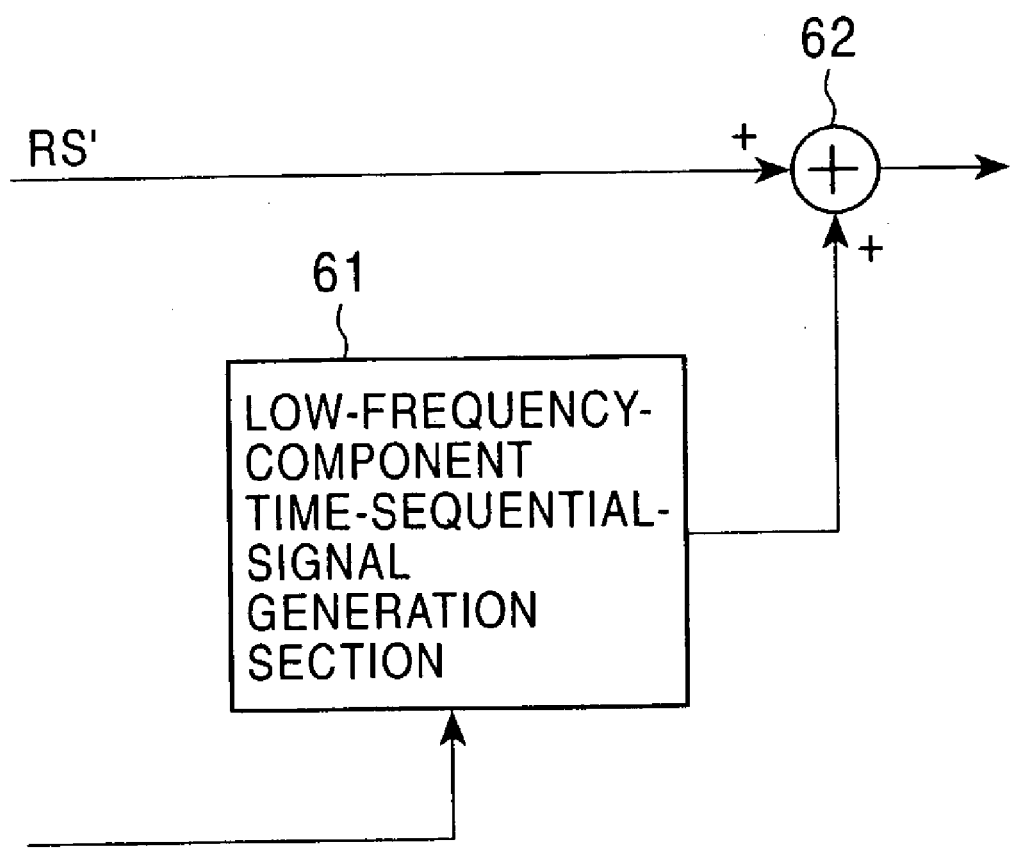
FIG. 12 is a block diagram showing an example structure of an acoustic-time-sequential-signal generation section shown in FIG. 11.

The generation section 52 is configured, for example, as shown in FIG. 12. The waveform information E sent from the code-string decomposition section 21 is input to a low-frequency-component time-sequential-signal generation section (hereinafter abbreviated as a generation section) 61, and the residual time-sequential signal RS' sent from the inverse amplitude control process section 24 is input to an adder 62.

The generation section 61 generates a low-frequency-component time-sequential signal ES' corresponding to the low-frequency-component time-sequential signal ES generated by the encoding apparatus 31 (the generation section 42 (shown in FIG. 5) of the generation section 32), according to the input waveform information E, and outputs it to the adder 62.

The adder 62 adds the low-frequency-component time-sequential signal ES' sent from the generation section 61 to the residual time-sequential signal RS' sent from the inverse amplitude control process section 24. Specifically, as a result, an acoustic time-sequential signal SS' corresponding to the acoustic time-sequential signal SS input to the encoding apparatus 31 and shown in FIG. 7A is, for example, generated.

The adder 62 outputs the generated acoustic time-sequential signal SS' to an external apparatus.

In the encoding apparatus 31 (shown in FIG. 4), described above, the waveform information E is encoded by the code-string generation section 14. The waveform information E can be normalized and quantized, and then encoded. When the waveform information E is normalized and quantized, and then encoded, however, quantized waveform information (hereinafter called waveform information QE) which includes a quantization error is sent to the decoding apparatus 51. In other words, since the low-frequency-component time-sequential signal ES' is generated according to the waveform information QE in the decoding apparatus 51, the low-frequency-component time-sequential signal ES' is different from the low-frequency-component time-sequential signal ES generated by the encoding apparatus 31, due to the quantization error included in the waveform information QE. Consequently, in this case, the acoustic time-sequential signal SS' similar to the acoustic time-sequential signal SS cannot be decoded, and a problem may occur in terms of hearing.

Figure 13:
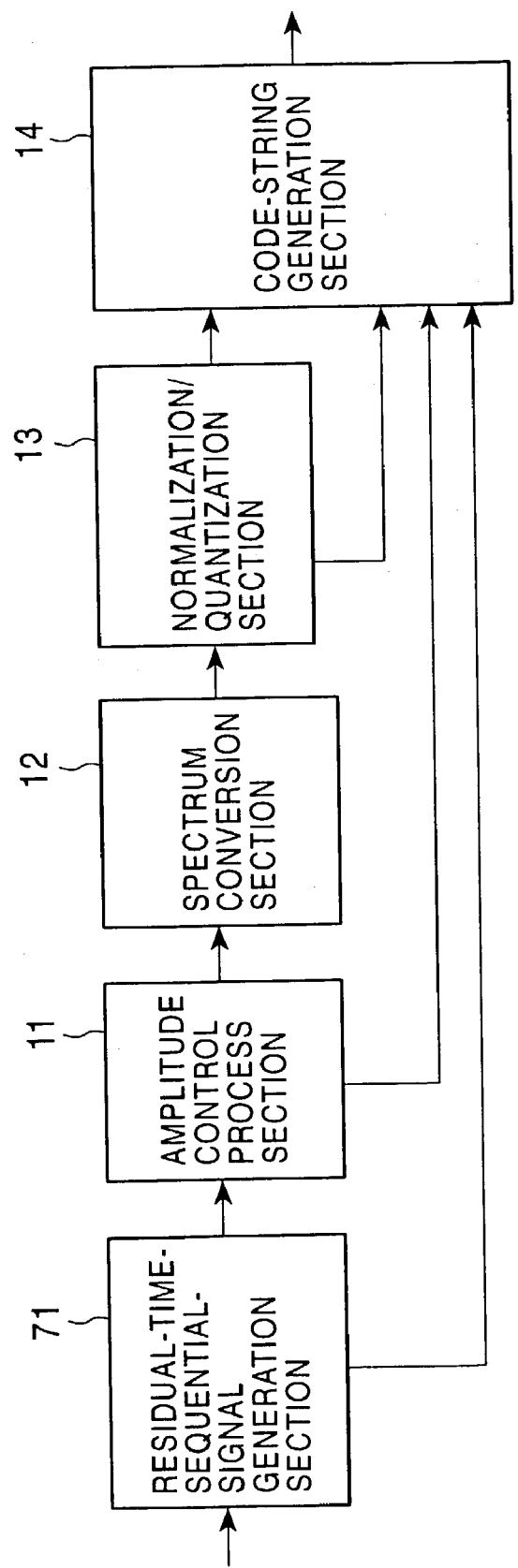
FIG. 13 is a block diagram showing another example structure of the encoding apparatus to which the present invention is applied.
Figure 15:
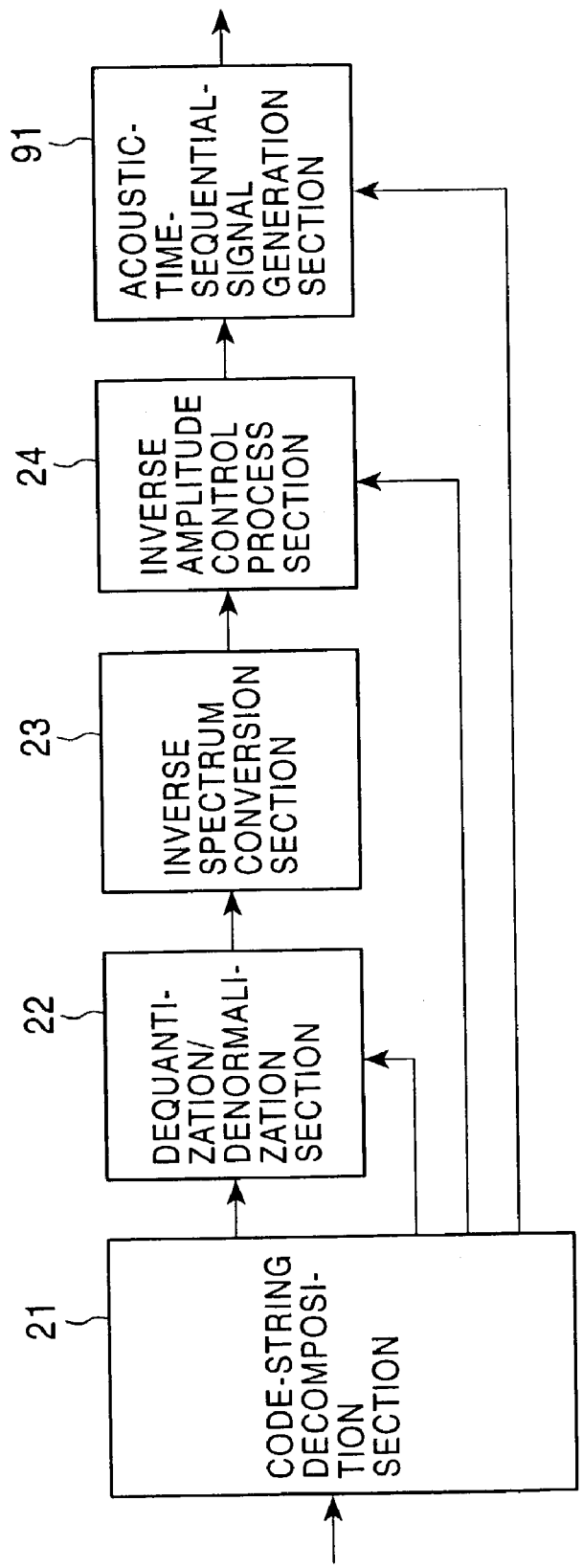
FIG. 15 is a block diagram showing another example structure of the decoding apparatus to which the present invention is applied.

When the encoding apparatus 31 is structured, for example, as shown in FIG. 13, and the decoding apparatus 51 is structured, for example, as shown in FIG. 15, even if waveform information E is quantized and encoded, an appropriate acoustic time-sequential signal SS' can be generated.

The encoding apparatus 31 shown in FIG. 13 is provided with a residual-time-sequential-signal generation section (hereinafter abbreviated as a generation section) 71 instead of the generation section 32 of the encoding apparatus 31 shown in FIG. 4. The other structures are the same as those shown in FIG. 4.

Figure 14:
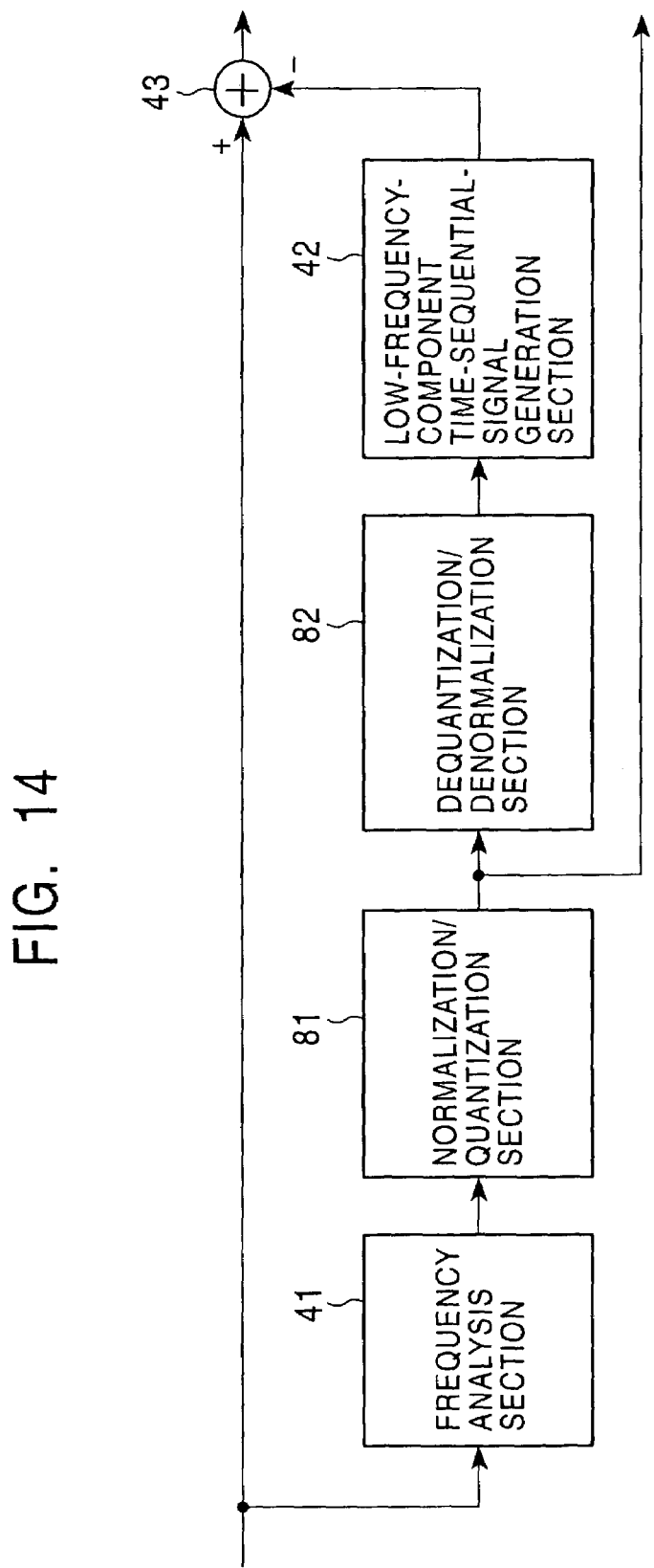
FIG. 14 is a block diagram showing an example structure of a residual-time-sequential-signal generation section shown in FIG. 13.

The generation section 71 is, for example, formed as shown in FIG. 14. Specifically, a normalization/quantization section 81 and a dequantization/denormalization section 82 are provided between the frequency analysis section 41 and the generation section 42 of the generation section 32 shown in FIG. 5.

The normalization/quantization section 81 normalizes and quantizes the waveform information E sent from the frequency analysis section 41, and outputs waveform information QE obtained as a result to the dequantization/denormalization section 82 and to the code-string generation section 14.

The dequantization/denormalization section 82 dequantizes and denormalizes the waveform information QE sent from the normalization/quantization section 81, and outputs waveform information E' obtained as a result and corresponding to the waveform information E generated by the frequency analysis section 41 to the generation section 42. The waveform information E' includes a quantization error.

The generation section 42 generates the low-frequency-component time-sequential signal ES according to the waveform information E' sent from the dequantization/denormalization section 82, and outputs the signal to the subtracter 43.

The subtracter 43 subtracts the low-frequency-component time-sequential signal ES (indirectly including a quantization error) sent from the generation section 42, from the input acoustic time-sequential signal SS to generate the residual time-sequential signal RS, and outputs it to the amplitude control process section 11.

An amplitude control process, spectrum conversion, normalization, and quantization are applied to the residual time-sequential signal RS to generate spectrum information QF. The generated spectrum information QF is encoded together with the waveform information QE and others, and sent to the decoding apparatus 51.

FIG. 15 shows an example structure of the decoding apparatus 51 for decoding a code string CD generated by the encoding apparatus 31 shown in FIG. 13. The decoding apparatus 51 is provided with an acoustic-time-sequential-signal generation section (hereinafter abbreviated as a generation section) 91 instead of the generation section 52 of the decoding apparatus 51 shown in FIG. 11. The other structures of the decoding apparatus 51 are the same as those shown in FIG. 11.

The code-string decomposition section 21 decomposes an input code string CD sent from the encoding apparatus 31 shown in FIG. 13 into spectrum information QF, quantization information Q, normalization information N, amplitude control process information G, and waveform information QE; and outputs the spectrum information QF, the quantization information Q, and the normalization information N to the dequantization/denormalization section 22, the amplitude control process information G to the inverse amplitude control process section 24, and the waveform information QE to the generation section 91.

Dequantization, denormalization, inverse spectrum conversion, and an inverse amplitude control process are applied to the spectrum information QF separated from the code string CD by the code-string decomposition section 21 to obtain a residual time-sequential signal RS'.

The generation section 91 dequantizes and dequantizes the waveform information QE sent from the code-string decomposition section 21 to decode the waveform information E'. The generation section 91 generates a low-frequency-component time-sequential signal ES' according to the wave information E', and adds it to the residual time-sequential signal RS' to generate an acoustic time-sequential signal SS'.

Since the low-frequency-component time-sequential signal ES' is generated according to the waveform information E' of the encoding apparatus 31, the low-frequency-component time-sequential signal ES' can be made the same as that used in the encoding apparatus.

In other words, since the encoding apparatus and the decoding apparatus can use the same low-frequency-component time-sequential signal, an appropriate acoustic time-sequential signal SS' is generated.

Figure 16:
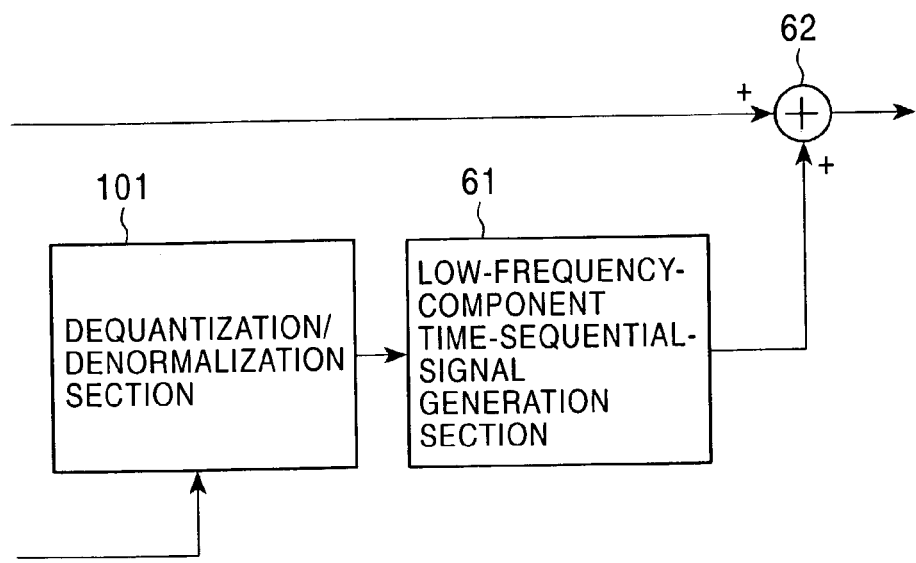
FIG. 16 is a block diagram showing an example structure of an acoustic-time-sequential-signal generation section shown in FIG. 15.

FIG. 16 shows an example structure of the generation section 91. The generation section 91 is provided with a dequantization/denormalization section 101 at a previous stage of the generation section 61 of the generation section 52 shown in FIG. 12.

The dequantization/denormalization section 101 dequantizes and denormalizes the waveform information QE sent from the code-string decomposition section 21, and outputs the waveform information E' obtained as a result, corresponding to the waveform information E generated by the encoding apparatus 31, to the generation section 61.

The generation section 61 generates a low-frequency-component time-sequential signal ES' according to the waveform information E' sent from the dequantization/denormalization section 101.

Figure 17A:
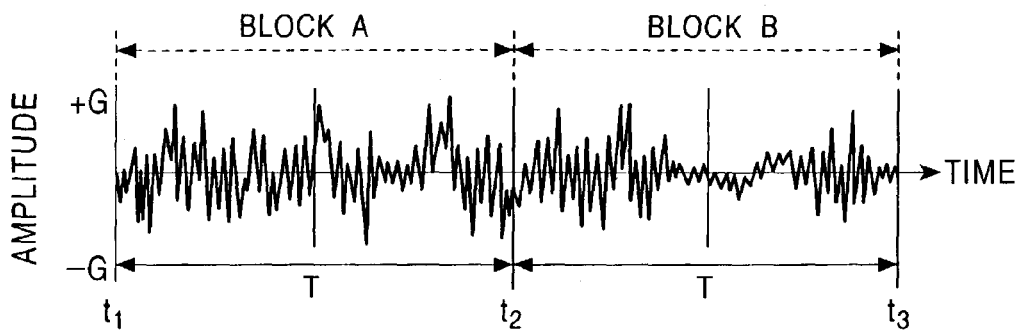
FIG. 17A is a view describing the operation of the encoding apparatus shown in FIG. 4.
Figure 17B:
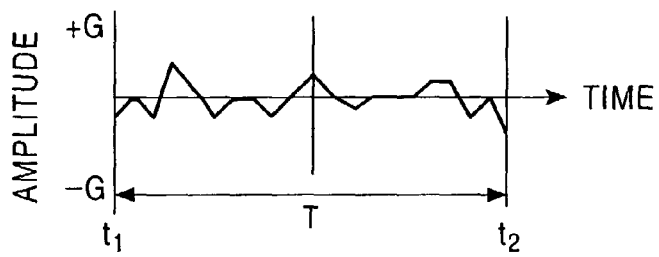
FIG. 17B is another view describing the operation of the encoding apparatus shown in FIG. 4.
Figure 17C:
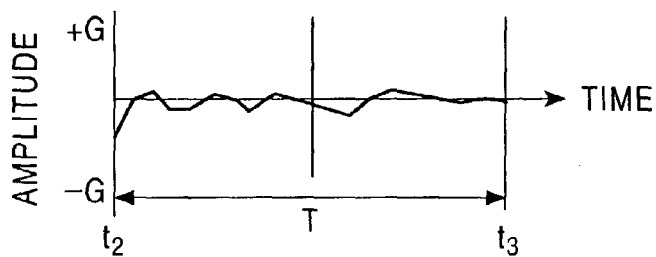
FIG. 17C is another view describing the operation of the encoding apparatus shown in FIG. 4.

When an acoustic time-sequential signal SS like that shown in FIG. 17A is input to the encoding apparatus 31 shown in FIG. 4 and described above, the generation section 32 handles, for example, an acoustic time-sequential signal SS input at a time $t_1$ for the period of a time T (from the time $t_1$ to a time $t_2$) as one block (block A), as shown in FIG. 17B, and an acoustic time-sequential signal SS input at the time $t_2$ for the period of the time T (from the time $t_2$ to a time $t_3$) as one block (block B), as shown in FIG. 17C. In other words, the acoustic time-sequential signal SS is divided so as not to overlap with each other.

As described above, however, since the number of frequencies fp to be processed, used for generating a low-frequency-component time-sequential signal ES is finite, and the number of their pure-tone waveforms are also finite, when a frequency analysis is applied to the acoustic time-sequential signal SS divided so as not to overlap with each other as described above, a low-frequency-component time-sequential signal ES discontinuous between adjacent blocks may be generated as a result. In other words, no appropriate acoustic time-sequential signal SS' may be generated by the decoding apparatus 51.

Figure 18:
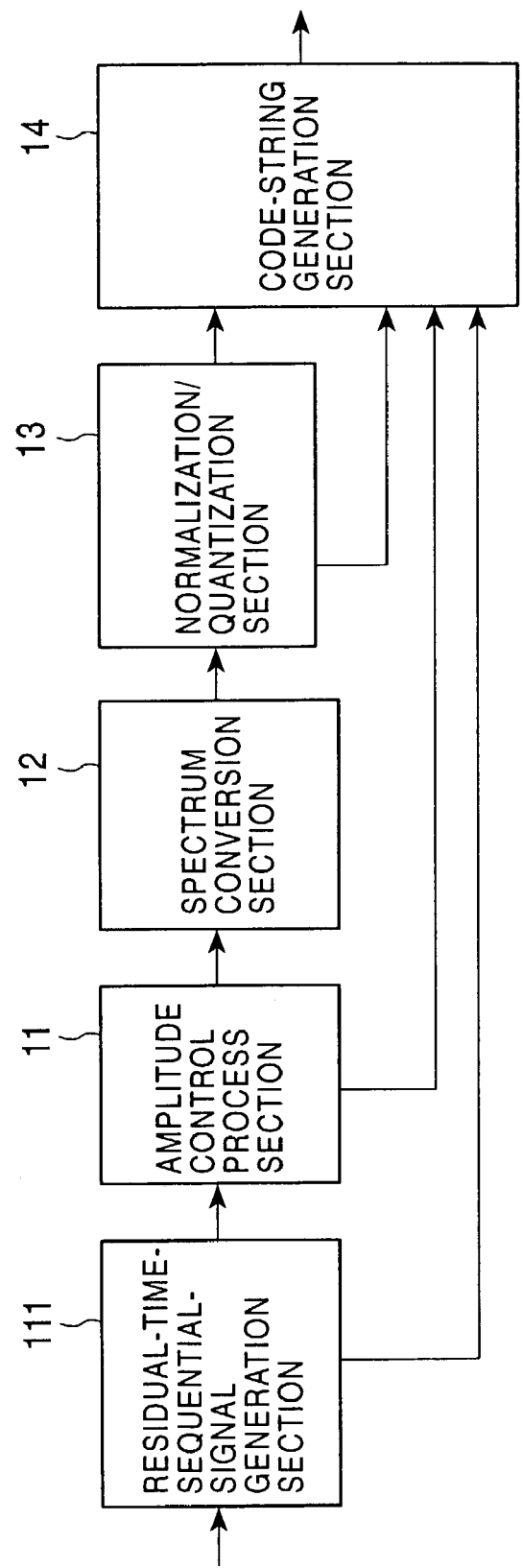
FIG. 18 is a block diagram showing another example structure of the encoding apparatus to which the present invention is applied.
Figure 21:
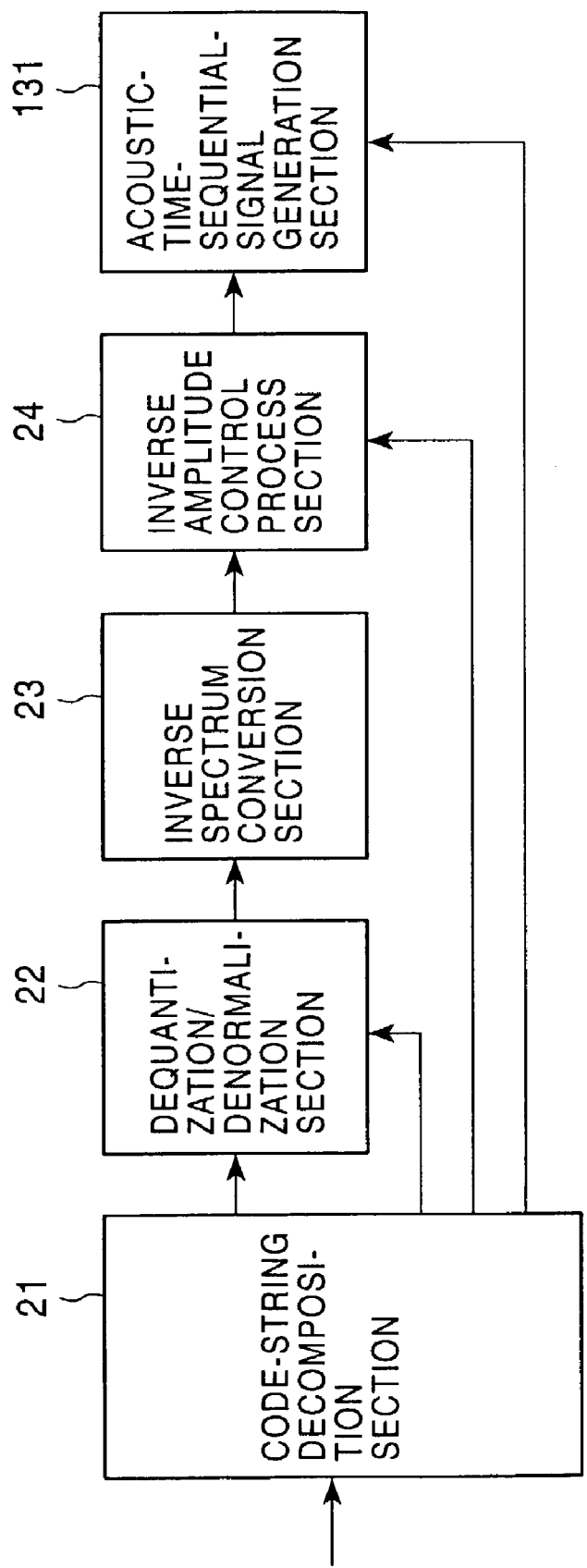
FIG. 21 is a block diagram showing another example structure of the decoding apparatus to which the present invention is applied.

When the encoding apparatus 31 is structured, for example, as shown in FIG. 18 and the decoding apparatus 51 is structured, for example, as shown in FIG. 21, a more appropriate acoustic time-sequential signal SS' can be generated.

The encoding apparatus 31 shown in FIG. 18 is provided with an acoustic time-sequential generation section (hereinafter abbreviated as a generation section) 111 instead of the generation section 32 of the encoding apparatus 31 shown in FIG. 4.

Figure 19:
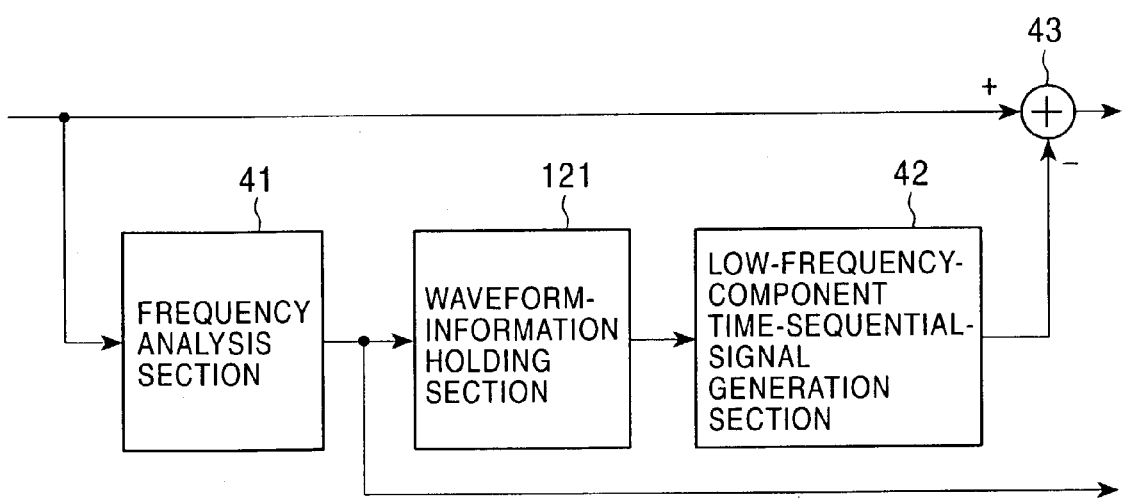
FIG. 19 is a block diagram showing an example structure of a residual-time-sequential-signal generation section shown in FIG. 18.

The generation section 111 is structured, for example, as shown in FIG. 19. Specifically, in the generation section 111, a waveform-information holding section 121 is provided between the frequency analysis section 41 and the generation section 42 of the generation section 32 shown in FIG. 5.

In this case, the acoustic time-sequential signal SS is divided into blocks by a division section not shown so as to overlap with each other partially.

Figure 20A:
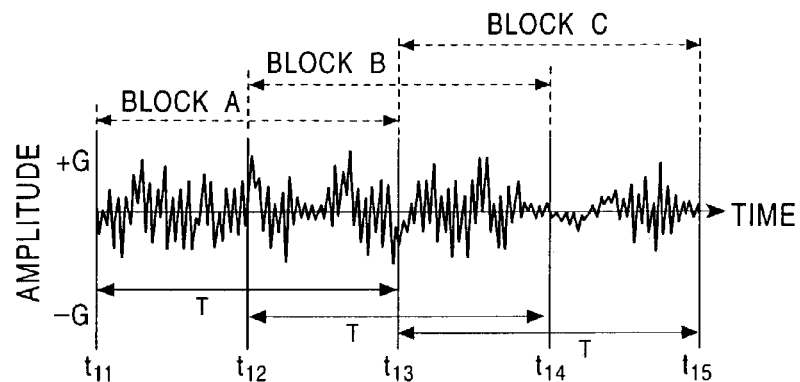
FIG. 20A is a view describing the operation of the encoding apparatus shown in FIG. 18.

In an acoustic time-sequential signal SS like that shown in FIG. 20A, for example, an acoustic time-sequential signal SS input at a time $t_{11}$ for the period of a time T (from the time $t_{11}$ to a time $t_{13}$) is handled as a block A, an acoustic time-sequential signal SS input at the time $t_{12}$ which is at the middle of the time $t_{11}$ and the time $t_{13}$, for the period of the time T (from the time $t_{12}$ to a time $t_{14}$) is handled as a block B, and an acoustic time-sequential signal SS input at the time $t_{13}$, which is at the middle of the time $t_{12}$ and the time $t_{14}$, for the period of the time T (from the time $t_{13}$ to a time $t_{15}$) is handled as a block C.

The frequency analysis section 41 applies frequency analysis to blocks of the acoustic time-sequential signal SS, which is divided into the blocks so as to overlap partially, generates waveform information E according to results of the analysis, and sequentially outputs to the waveform-information holding section 121.

The waveform-information holding section 121 stores three blocks of waveform information E sent from the frequency analysis section 41, and outputs it collectively to the generation section 42.

More specifically, when the waveform-information holding section 121 receives one block of waveform information E from the frequency analysis section 41, the waveform-information holding section 121 outputs three blocks of waveform information E (hereinafter, among the three blocks of waveform information E stored in the waveform-information holding section 121, waveform information E stored earliest is called waveform information $E_1$, waveform information E stored next is called waveform information $E_2$, and waveform information E stored latest is called waveform information $E_3$) stored so far to the generation section 42.

Then, the waveform-information holding section 121 deletes the waveform information $E_1$ which has been stored; and stores the waveform information which has been stored as the waveform information $E_2$, as waveform information $E_1$, the waveform information which has been stored as the waveform information $E_3$, as waveform information $E_2$, and waveform information input from the frequency analysis section 41 as waveform information $E_3$.

Each time when the waveform-information holding section 121 receives waveform information E from the frequency analysis section 41, the waveform-information holding section 121 repeats the same operations as described above. In other words, the generation section 42 receives waveform information $E_1$ to waveform information $E_3$ generated from partially overlapping blocks of the acoustic time-sequential signal SS.

Figure 20B:
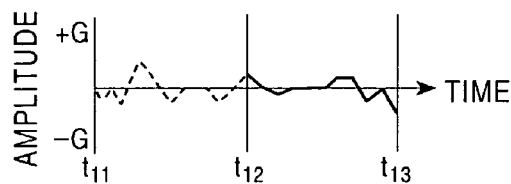
FIG. 20B is another view describing the operation of the encoding apparatus shown in FIG. 18.
Figure 20C:
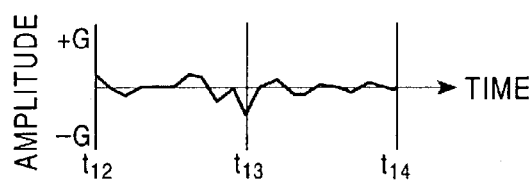
FIG. 20C is another view describing the operation of the encoding apparatus shown in FIG. 18.
Figure 20D:
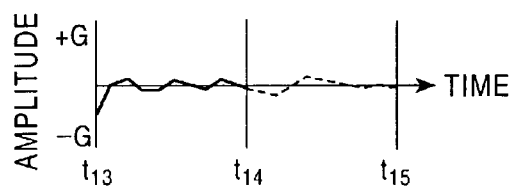
FIG. 20D is another view describing the operation of the encoding apparatus shown in FIG. 18.

First, the generation section 42 generates, for example, low-frequency-component time-sequential signals $ES_1$ to $ES_3$ shown in FIG. 20B to FIG. 20D according to the waveform information $E_1$ to the waveform information $E_3$.

Figure 20E:
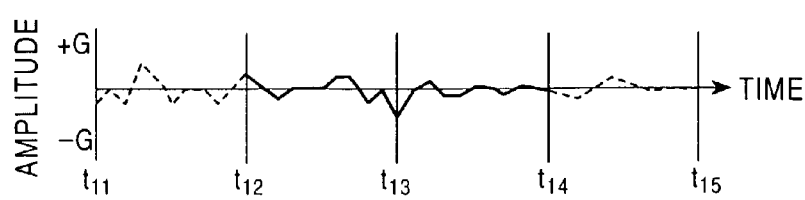
FIG. 20E is another view describing the operation of the encoding apparatus shown in FIG. 18.

Then, the generation section 42 adds a part (part indicated by a solid line in FIG. 20B) of the low-frequency-component time-sequential signal $ES_1$, which overlaps with the low-frequency time-sequential signal $ES_2$ on a time domain, to the generated low-frequency-component time-sequential signal $ES_2$ (shown in FIG. 20C), adds a part (part indicated by a solid line in FIG. 20D) of the low-frequency-component time-sequential signal $ES_3$, which overlaps with the low-frequency time-sequential signal $ES_2$ on the time domain, to the generated low-frequency-component time-sequential signal $ES_2$ (shown in FIG. 20C), multiplies the sum by a window function indicated by an expression (13) to generate a low-frequency time-sequential signal ES like that indicated by a solid line in FIG. 20E and outputs it to the subtracter 43.

$$W(t)=0.5\times(1-\cos(2\pi t/L)) \qquad (13)$$

The low-frequency-component time-sequential signal ES generated in this way is not discontinuous between blocks.

FIG. 21 shows an example structure of the decoding apparatus 51 for decoding a code string CD generated by the encoding apparatus 31 shown in FIG. 18.

The decoding apparatus is provided with an acoustic time-sequential generation section (hereinafter abbreviated as a generation section) 131 instead of the generation section 52 of the decoding apparatus 51 shown in FIG. 11. Since the other portions are the same as those shown in FIG. 11, a description thereof is omitted.

Figure 22:
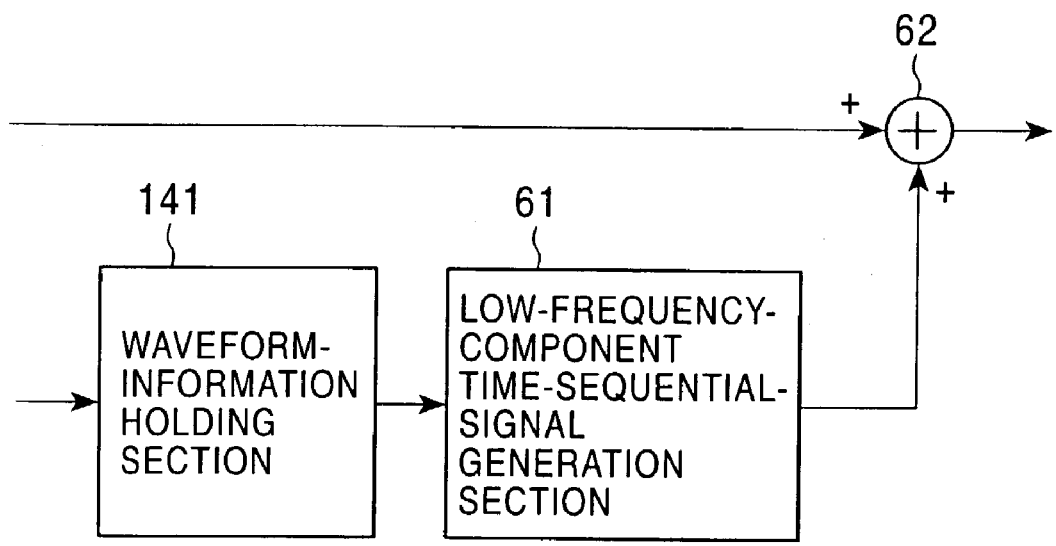
FIG. 22 is a block diagram showing an example structure of an acoustic-time-sequential-signal generation section shown in FIG. 21.

The generation section 131 is structured, for example, as shown in FIG. 22. Specifically, the generation section 131 is provided with a waveform-information holding section 141 at a previous stage of the generation section 61 shown in FIG. 12.

The waveform-information holding section 141 operates in the same way as the waveform-information holding section 121 of the generation section 111 in the encoding apparatus 31, holds three blocks of waveform information $E_1$ to $E_3$, and outputs to the generation section 61.

The generation section 61 operates in the same way as the generation section 42 of the generation section 111 in the encoding apparatus 31, generates low-frequency-component time-sequential signals $ES_1$ to $ES_3$ according to the three blocks of waveform information $E_1$ to $E_3$ sent from the waveform-information holding section 141, synthesizes the generated low-frequency-component time-sequential signals $ES_1$ to $ES_3$ as described by referring to FIG. 20, multiplies the sum by the window function w(t) indicated by the expression (13), and outputs the final low-frequency-component time-sequential signal ES obtained as a result to the adder 62.

In the encoding apparatus 31 shown in FIG. 4, described above, the acoustic time-sequential signal SS is encoded without being divided into bands. When a band division is applied, encoding efficiency increases.

Figure 23:
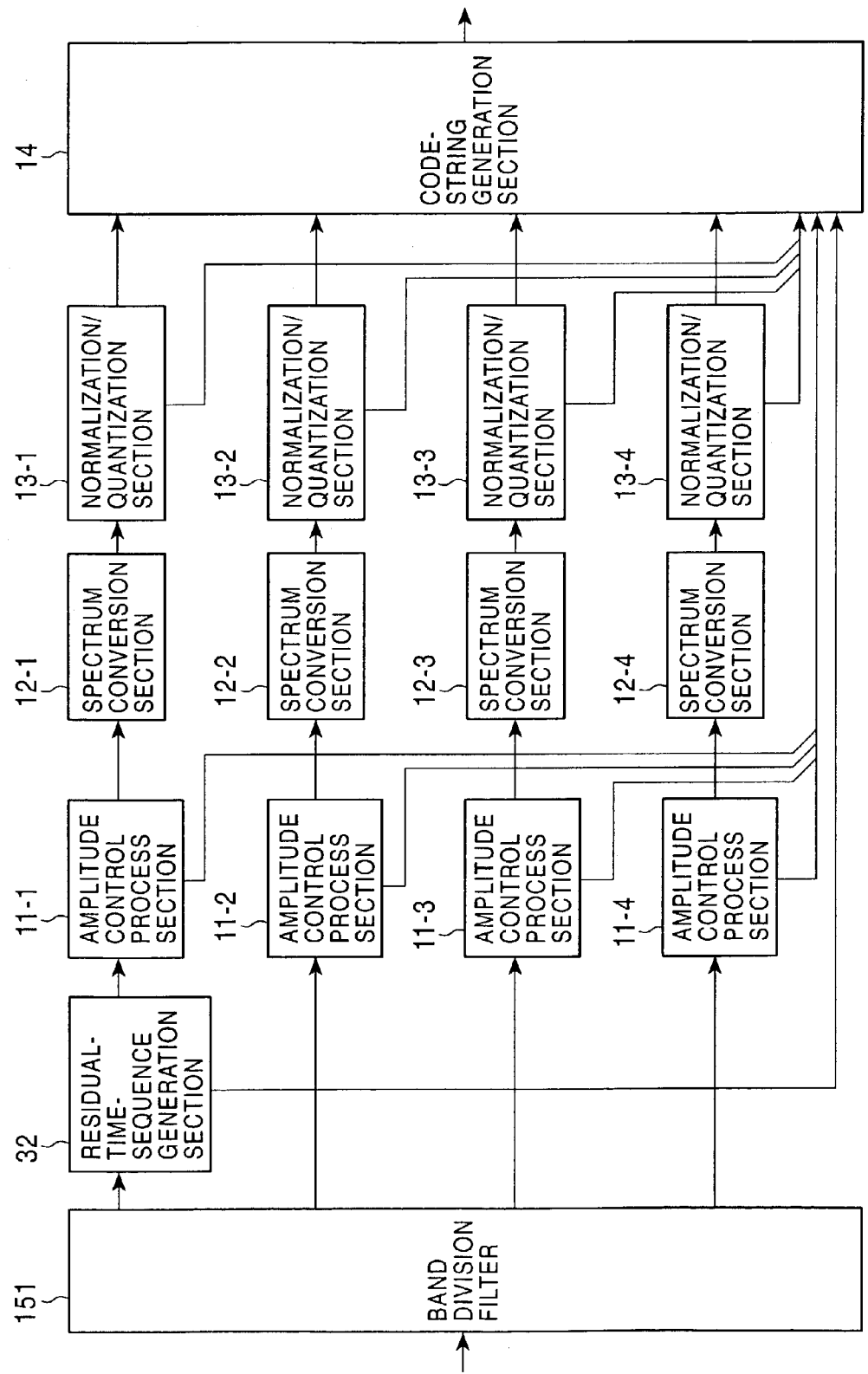
FIG. 23 is a block diagram showing another example structure of the encoding apparatus to which the present invention is applied.
Figure 24:
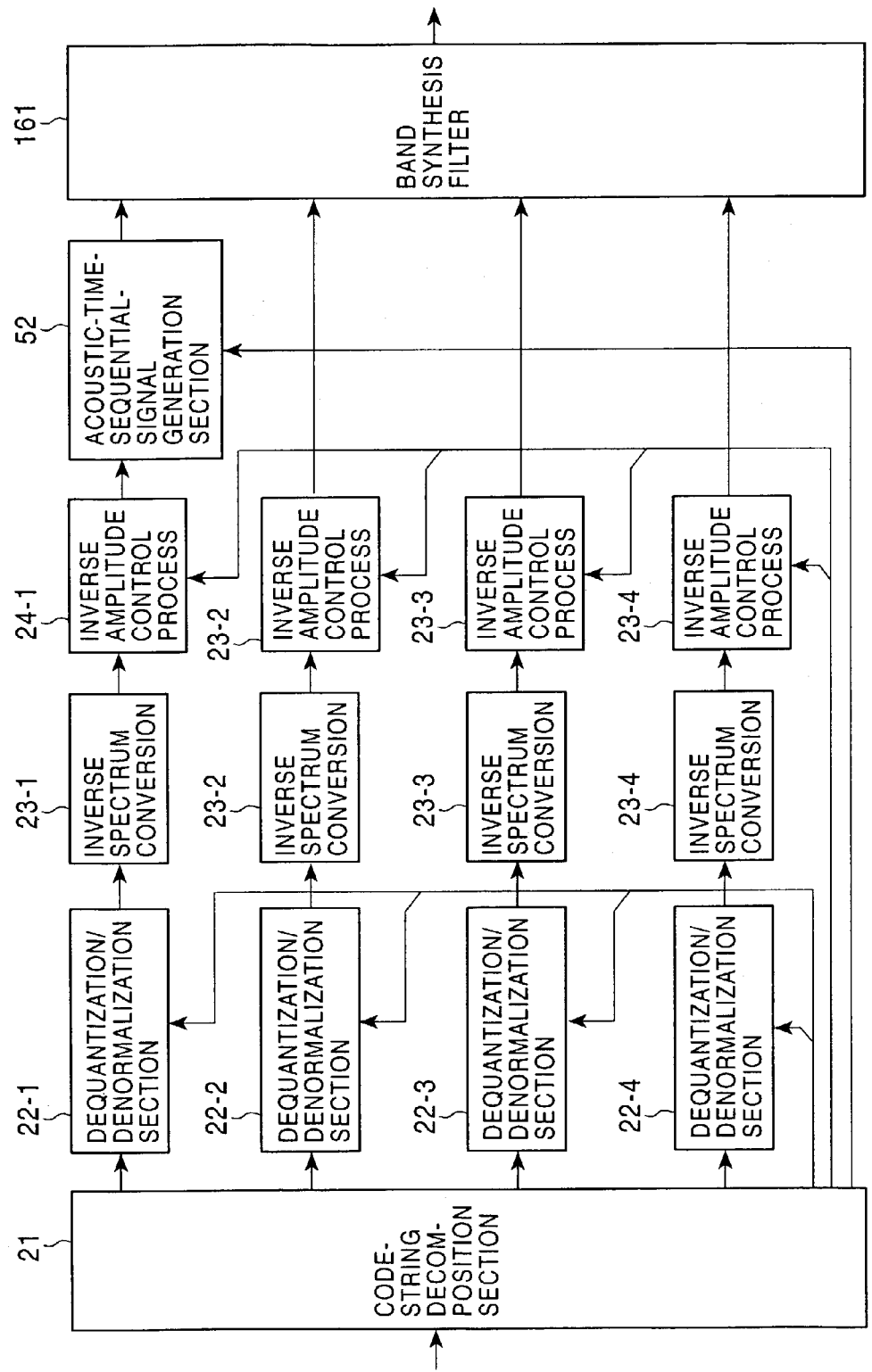
FIG. 24 is a block diagram showing another example structure of the decoding apparatus to which the present invention is applied.

When the encoding apparatus 31 is structured, for example, as shown in FIG. 23, and the decoding apparatus 51 is structured, for example, as shown in FIG. 24, an acoustic time-sequential signal SS can be divided into bands and encoded.

The encoding apparatus 31 shown in FIG. 23 is formed of the residual time-sequential generation section 32, amplitude control process sections 11-1 to 11-4, spectrum conversion sections 12-1 to 12-4, normalization/quantization sections 13-1 to 13-4, the code-string generation section 14, and a band-division filter 151 provided at a previous stage of the generation section 32.

The band division filter 151 divides an input acoustic time-sequential signal SS into four bands with the use of a PQF (polyphase quadrature filter) or a QMF (quadrature mirror filter), generates band signals $FS_1$ to $FS_4$, and outputs the band signal $FS_1$ to the generation section 32, the band signal $FS_2$ to the amplitude control process section 11-2, the band signal $FS_3$ to the amplitude control process section 11-3, and the band signal $FS_4$ to the amplitude control process section 11-4.

Since the residual time-sequential generation section 32, the amplitude control process sections 11-1 to 11-4, the spectrum conversion sections 12-1 to 12-4, the normalization/quantization sections 13-1 to 13-4, the code-string generation section 14 operate in the same way as in the case shown in FIG. 4, a detailed description thereof is omitted. The amplitude control process section 11-1 applies an amplitude control process to a residual time-sequential signal RS sent from the generation section 32, and the amplitude control process sections 11-2 to 11-4 apply amplitude control processes to the band signals $FS_2$ to $FS_4$.

The code-string generation section 14 receives waveform information E from the generation section 32, amplitude control process information $G_1$ to $G_4$ from the amplitude control process sections 11-1 to 11-4, and spectrum information $QF_1$ to $QF_4$, quantization information $Q_1$ to $Q_4$, and normalization information $N_1$ to $N_4$ from the normalization/quantization section 13-1 to 13-4; and sequentially encodes them to generate a code string.

The decoding apparatus 51 shown in FIG. 24 is formed of one code-string decomposition section 21, four dequantization/denormalization sections 22-1 to 22-4, four inverse spectrum conversion sections 23-1 to 23-4, four inverse amplitude control process sections 24-1 to 24-4, one generation section 52, each of the above being included in the decoding apparatus 51 shown in FIG. 11, and one band synthesis filter 161.

The code-string decomposition section 21 decomposes an input code string CD into four pieces of spectrum information $QF_1$ to $QF_4$, four pieces of quantization information $Q_1$ to $Q_4$, four pieces of normalization information $N_1$ to $N_4$, amplitude control process information $G_1$ to $G_4$, and one piece of waveform information E; and outputs the spectrum information $QF_1$ to $QF_4$, the quantization information $Q_1$ to $Q_4$, and the normalization information $N_1$ to $N_4$ to the dequantization/denormalization sections 22-1 to 22-4, the four pieces of amplitude control process information $G_1$ to $G_4$ to the inverse amplitude control process sections 24-1 to 24-4, and the waveform information E to the generation section 52.

Since the dequantization/denormalization sections 22-1 to 22-4, the inverse spectrum conversion sections 23-1 to 23-4, the inverse amplitude control process sections 24-1 to 24-4, and the generation section 52 operate in the same way as in the case shown in FIG. 11, a detailed description thereof is omitted. The generation section 52 outputs an acoustic time-sequential signal SS', and the inverse amplitude control process section 24-2 to 24-4 output time-sequential signals $GS'_2$ to $GS'_4$, to the band synthesis filter 161.

The band synthesis filter 161 synthesizes the signals with the use of, for example, an IPQF (inverse polyphase quadrature filter) or an IQMF (inverse quadrature filter) to generate a final acoustic time-sequential signal SS', and outputs it to an external apparatus.

As described above, the process of the generation section 32 of the encoding apparatus 31 is applied to a predetermined band signal (for example, the band signal $FS_1$ in the above embodiment) for an amplitude control process, and the other band signals (for example, the band signals $FS_2$ to $FS_4$) are encoded as in a conventional case, so that the acoustic time-sequential signal SS is efficiently encoded. The present invention can be applied to an audio recording and reproduction apparatus.

The above-described series of processing can be executed not only by hardware but also by software. When the series of processing is executed by software, a program constituting the software is installed into a computer, and the program is executed by the computer to functionally implement the above-described encoding apparatus 31 and decoding apparatus 51.

FIG. 25 is a block diagram showing the structure of a computer 501 functioning as the above-described encoding apparatus 31 and decoding apparatus 51, according to one embodiment. A CPU (central processing unit) 511 is connected to an input-and-output interface 516 through a bus 515. When the CPU 511 receives an instruction through the input-and-output interface 516 and an input section 518 formed of a keyboard, a mouse, and others, from the user, the CPU 511 loads the program stored in a recording medium such as a ROM (read only memory) 512, a hard disk 514, or a magnetic disk 531, an optical disk 532, a magneto-optical disk 533, or a semiconductor memory 534 mounted to a drive 520, into a RAM (random access memory) 513 and executes it. With this operation, the above-described various processes are performed. In addition, the CPU 511 outputs a result of the process, for example, to a display section 517 formed of an LCD (liquid crystal display) and others through the input-and-output interface 516, as required. The program can be stored in advance in the hard disk 514 or the ROM 512, and provided for the user collectively with the computer 501; can be provided as a package medium, such as the magnetic disk 531, the optical disk 532, the magneto-optical disk 533, or the semiconductor memory 534; or can be provided for the hard disk 514 through a communication section 519 from a satellite, a network, or others.

In the present specification, steps describing the program provided by a recording medium include not only processing to be executed in a time-sequential manner in a described order but processing which is not necessarily executed time-sequentially but is executed in parallel or independently.

INDUSTRIAL APPLICABILITY

According to the present invention, the occurrence of pre-echo and post-echo can be suppressed.

The invention claimed is:

1. An encoding apparatus characterized by comprising:
   division means for dividing an input time-sequential signal into predetermined-length blocks;
   low-frequency-component-signal generation means for applying a predetermined frequency analysis to the input time-sequential signal in the blocks and for generating a low-frequency-component signal according to predetermined waveform information based on a result of the analysis;
   residual-signal generation means for removing the low-frequency-component signal from the input time-sequential signal in the blocks to generate a residual signal;
   amplitude control process means for analyzing the amplitude of the residual signal and for applying a predetermined amplitude control process to the residual signal according to predetermined amplitude control process information based on a result of the analysis to generate a signal to be quantized;
   quantization means for quantizing the signal to be quantized to generate a quantized signal; and
   code-string generation means for encoding the waveform information, the amplitude control process information, and the quantized signal to generate a code string.

2. An encoding apparatus according to claim 1, characterized in that
   the quantization means comprises:
   frequency-component generation means for converting the signal to be quantized to frequency components to generate a frequency-component signal; and
   means for normalizing and quantizing the frequency-component signal to generate the quantized signal.

3. An encoding apparatus according to claim 2, characterized in that
   the frequency-component generation means applies spectrum conversion to the signal to be quantized to generate the frequency-component signal.

4. An encoding apparatus according to claim 1, characterized in that
   the low-frequency-component-signal generation means performs the frequency analysis according to a general harmonic analysis method, and generates the low-frequency-component signal according to the waveform information based on a result of the analysis.

5. An encoding apparatus according to claim 1, characterized in that
   the low-frequency-component-signal generation means quantizes the waveform information to generate quantized waveform information, dequantizes the quantized waveform information to generate dequantized waveform information, and generates the low-frequency-component signal according to the dequantized waveform information; and
   the code-string generation means encodes the quantized waveform information, the amplitude control process information, and the quantized signal to generate the code string.

6. An encoding apparatus according to claim 1, characterized in that
   the division means divides the input time-sequential signal into the blocks such that a part of the input time-sequential signal overlaps; and
   the low-frequency-component-signal generation means synthesizes a low-frequency-component signal in a block concerned, a low-frequency-component signal in the previous block, overlapping with the signal in the block concerned, and a low-frequency-component signal in the next block, overlapping with the signal in the block concerned, in a time domain to generate a low-frequency-component signal.

7. An encoding apparatus according to claim 6, characterized in that the low-frequency-component-signal generation means applies a window function to the low-frequency-component signal.

8. An encoding apparatus for dividing an input time-sequential signal into M band signals, for dividing the band signals into predetermined blocks, and for encoding them, characterized by comprising:
   low-frequency-component-signal generation means for applying a predetermined frequency analysis to a signal in a block of at least one band signal and for generating a low-frequency-component signal according to predetermined waveform information based on a result of the analysis;
   residual-signal generation means for removing the low-frequency-component signal from the band signal to generate a residual signal; and
   amplitude control process means for analyzing the amplitude of the residual signal and for applying a predetermined amplitude control process to the residual signal according to predetermined amplitude control process information based on a result of the analysis to generate a signal to be quantized.

9. An encoding method characterized by comprising:
   a division step of dividing an input time-sequential signal into predetermined-length blocks;
   a low-frequency-component-signal generation step of applying a predetermined frequency analysis to the input time-sequential signal in the blocks and of generating a low-frequency-component signal according to predetermined waveform information based on a result of the analysis;
   a residual-signal generation step of removing the low-frequency-component signal from the input time-sequential signal in the blocks to generate a residual signal;
   an amplitude control process step of analyzing the amplitude of the residual signal and of applying a predetermined amplitude control process to the residual signal according to predetermined amplitude control process information based on a result of the analysis to generate a signal to be quantized;
   a quantization step of quantizing the signal to be quantized to generate a quantized signal; and
   a code-string generation step of encoding the waveform information, the amplitude control process information, and the quantized signal to generate a code string.

10. A recording medium storing a computer-readable program, the program characterized by comprising:
    a division step of dividing an input time-sequential signal into predetermined-length blocks;
    a low-frequency-component-signal generation step of applying a predetermined frequency analysis to the input time-sequential signal in the blocks and of generating a low-frequency-component signal according to predetermined waveform information based on a result of the analysis;

a residual-signal generation step of removing the low-frequency-component signal from the input time-sequential signal in the blocks to generate a residual signal;

an amplitude control process step of analyzing the amplitude of the residual signal and of applying a predetermined amplitude control process to the residual signal according to predetermined amplitude control process information based on a result of the analysis to generate a signal to be quantized;

a quantization step of quantizing the signal to be quantized to generate a quantized signal; and a code-string generation step of encoding the waveform information, the amplitude control process information, and the quantized signal to generate a code string.

11. A decoding apparatus for receiving a code string generated by encoding a time-sequential signal in each block and for decoding it, characterized by comprising:

decomposition means for decomposing the code string into waveform information, amplitude control process information, and a quantized signal;

means for dequantizing the quantized signal;

inverse amplitude control process means for applying an amplitude control process inverse to that performed in encoding, to the dequantized signal according to the amplitude control process information to generate a signal to which the amplitude control process has been applied;

low-frequency-component-signal generation means for generating a low-frequency-component signal according to the waveform information; and means for generating a time-sequential signal from the signal to which the amplitude control process has been applied, and the low-frequency-component signal.

12. A decoding apparatus according to claim 11, characterized in that when the waveform information has been quantized, the low-frequency-component-signal generation means dequantizes the quantized waveform information and, according to information obtained as a result, generates the low-frequency-component signal.

13. A decoding apparatus according to claim 11, characterized in that when division has been made such that a part of the blocks overlap, the low-frequency-component-signal generation means synthesizes a low-frequency-component signal in a block concerned, a low-frequency-component signal in the previous block, overlapping with the signal in the block concerned, and a low-frequency-component signal in the next block, overlapping with the signal in the block concerned, in a time domain to generate a low-frequency-component signal.

14. A decoding method for receiving a code string generated by encoding a time-sequential signal in each block and for decoding it, characterized by comprising:

a decomposition step of decomposing the code string into waveform information, amplitude control process information, and a quantized signal;

a step of dequantizing the quantized signal;

an inverse amplitude control process step of applying an amplitude control process inverse to that performed in encoding, to the dequantized signal according to the amplitude control process information to generate a signal to which the amplitude control process has been applied;

a low-frequency-component-signal generation step of generating a low-frequency-component signal according to the waveform information; and a step of generating a time-sequential signal from the signal to which the amplitude control process has been applied, and the low-frequency-component signal.

15. A recording medium storing a computer-readable program for a decoding apparatus which receives a code string generated by encoding a time-sequential signal in each block and decodes it, the program characterized by comprising:

a decomposition step of decomposing the code string into waveform information, amplitude control process information, and a quantized signal;

a step of dequantizing the quantized signal;

an inverse amplitude control process step of applying an amplitude control process inverse to that performed in encoding, to the dequantized signal according to the amplitude control process information to generate a signal to which the amplitude control process has been applied;

a low-frequency-component-signal generation step of generating a low-frequency-component signal according to the waveform information; and a step of generating a time-sequential signal corresponding to an encoded time-sequential signal, from the signal to which the amplitude control process has been applied, and the low-frequency-component signal.

* * * * *